United States Patent
Ogawa et al.

(10) Patent No.: US 11,284,507 B2
(45) Date of Patent: Mar. 22, 2022

(54) WIRING BOARD AND METHOD FOR MANUFACTURING WIRING BOARD

(71) Applicants: DAI NIPPON PRINTING CO., LTD., Tokyo-to (JP); THE UNIVERSITY OF TOKYO, Tokyo-to (JP)

(72) Inventors: Kenichi Ogawa, Tokyo-to (JP); Takao Someya, Tokyo-to (JP)

(73) Assignees: DAI NIPPON PRINTING CO., LTD., Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 16/755,765

(22) PCT Filed: Oct. 12, 2018

(86) PCT No.: PCT/JP2018/038196
§ 371 (c)(1),
(2) Date: Apr. 13, 2020

(87) PCT Pub. No.: WO2019/074115
PCT Pub. Date: Apr. 18, 2019

(65) Prior Publication Data
US 2020/0260573 A1 Aug. 13, 2020

(30) Foreign Application Priority Data
Oct. 12, 2017 (JP) .............................. JP2017-198758

(51) Int. Cl.
*H05K 1/02* (2006.01)
*H05K 1/18* (2006.01)
(Continued)

(52) U.S. Cl.
CPC ......... *H05K 1/0271* (2013.01); *H05K 1/0281* (2013.01); *H05K 1/181* (2013.01);
(Continued)

(58) Field of Classification Search
CPC .... H05K 1/0271; H05K 1/0281; H05K 1/181; H05K 3/0014; H05K 3/303; H05K 3/32;
(Continued)

(56) References Cited

U.S. PATENT DOCUMENTS 5,224,265 A * 7/1993 Dux .................... H01L 21/4857
257/E23.172
10,959,326 B2 * 3/2021 Okimoto .................. H01B 7/08
(Continued)

FOREIGN PATENT DOCUMENTS

JP 2007-281406 A 10/2007
JP 2012-054192 A 3/2012
(Continued)

OTHER PUBLICATIONS

Xiaolong Wang et al., "Stretchable Conductors With Ultrahigh Tensile Strain and Stable Metallic Conductance Enabled by Prestrained Polyelectrolyte Nanoplatforms", Advanced Materials, 23, 3090-3094, 2011.
(Continued)

*Primary Examiner* — Ishwarbhai B Patel
(74) *Attorney, Agent, or Firm* — Oliff PLC

(57) ABSTRACT

A wiring board includes: a substrate first elastic modulus including a first surface and second surface positioned on the opposite side of the first surface; wiring positioned on the first surface side of the substrate and connected to an electrode of an electronic component mounted on the wiring board; and a reinforcing member second elastic modulus greater than the first elastic modulus and including a first reinforcing part positioned on the first surface side of the substrate or on the second surface side of the substrate and partially overlaps the electronic component mounted on the wiring board when viewed along the normal direction of the first surface of the substrate. The wiring includes a section
(Continued)

that does not overlap the reinforcing member when viewed along the normal direction of the first surface including pluralities of peaks and valleys aligned along a planar direction of the first surface of the substrate.

25 Claims, 23 Drawing Sheets

(51) Int. Cl.
  *H05K 3/00* (2006.01)
  *H05K 3/30* (2006.01)
  *H05K 3/32* (2006.01)
  *H05K 1/11* (2006.01)

(52) U.S. Cl.
  CPC ........... *H05K 3/0014* (2013.01); *H05K 3/303* (2013.01); *H05K 3/32* (2013.01); *H05K 1/11* (2013.01); *H05K 2201/2009* (2013.01)

(58) Field of Classification Search
  CPC .... H05K 2201/2009; H05K 1/02; H05K 1/03; H05K 3/00; H01B 7/06
  See application file for complete search history.

(56) References Cited

U.S. PATENT DOCUMENTS

| | | | |
|---|---|---|---|
| 2004/0192082 A1* | 9/2004 | Wagner | H05K 1/11 439/67 |
| 2008/0157235 A1* | 7/2008 | Rogers | H05K 1/0283 257/415 |
| 2009/0317639 A1* | 12/2009 | Axisa | H05K 1/0283 428/411.1 |
| 2010/0132981 A1* | 6/2010 | Muro | H05K 1/0236 174/250 |
| 2012/0051005 A1* | 3/2012 | Vanfleteren | H01L 23/3142 361/749 |
| 2012/0052268 A1 | 3/2012 | Axisa et al. | |
| 2014/0218872 A1* | 8/2014 | Park | H05K 1/0283 361/749 |
| 2014/0240932 A1 | 8/2014 | Hsu | |
| 2014/0299362 A1 | 10/2014 | Park et al. | |
| 2015/0065840 A1* | 3/2015 | Bailey | A61B 5/0492 600/384 |
| 2015/0173186 A1* | 6/2015 | Na | H05K 1/0283 174/254 |
| 2018/0192520 A1* | 7/2018 | Choong | H01L 23/3121 |

FOREIGN PATENT DOCUMENTS

| | | |
|---|---|---|
| JP | 2016-509375 A | 3/2016 |
| KR | 10-2009-0092982 A | 9/2009 |
| KR | 10-2014-0058239 A | 5/2014 |
| TW | I263466 B | 10/2006 |
| TW | 201709222 A | 3/2017 |

OTHER PUBLICATIONS

Apr. 14, 2020 International Preliminary Report on Patentability issued International Patent Application No. PCT/JP2018/038196.
Jun. 14, 2019 Office Action issued in Japanese Patent Application No. 2019-519357.
Jan. 8, 2019 International Search Report issued in International Patent Application No. PCT/JP2018/038196.
Jul. 12, 2021 Office Action issued in Taiwanese Patent Application No. 107135987.
May 31, 2021 Search Report Issued in European Patent Application No. 18865635.9.

* cited by examiner

US 11,284,507 B2

WIRING BOARD AND METHOD FOR MANUFACTURING WIRING BOARD

TECHNICAL FIELD

An embodiment of the present disclosure relates to a wiring board comprising a substrate; and electronic components and wiring that are positioned on a first surface side of the substrate. The embodiment of the present disclosure further relates to a method for manufacturing a wiring board.

BACKGROUND ART

In recent years, there has been research on electronic devices that have deformability such as stretchability. For example, Patent Literature 1 discloses a stretchable wiring board that comprises a substrate and wiring provided on the substrate. In Patent Literature 1, a manufacturing method is adopted in which a circuit is provided on a substrate that is in a pre-extended state and the substrate is relaxed after the circuit has been formed. Patent Literature 1 is directed toward enabling a thin film transistor on the substrate to function favorably irrespective of whether the substrate is in a stretched state or a relaxed state.

CITATION LIST

Patent Literature

Patent Literature 1: Japanese Unexamined Patent Publication No. 2007-281406

SUMMARY OF INVENTION

The wiring board includes not only a section that is resistant to deformation such as extension or contraction but also a section that is easily damaged due to deformation. Hence, when a circuit is provided on substrate in a pre-extended state, defects such as damage to the wiring board readily occurs.

The purpose of the embodiment of the present disclosure is to provide a wiring board and a method for manufacturing the wiring board that enable the foregoing problems to be resolved effectively.

One embodiment of the present disclosure is a wiring board, comprising: a substrate having a first elastic modulus, the substrate including a first surface and a second surface positioned on the opposite side of the first surface; wiring positioned on the first surface side of the substrate and connected to an electrode of an electronic component mounted on the wiring board; and a reinforcing member having a second elastic modulus greater than the first elastic modulus, the reinforcing member at least including a first reinforcing part that is positioned on the first surface side of the substrate or on the second surface side of the substrate and that at least partially overlaps the electronic component mounted on the wiring board when viewed along the normal direction of the first surface of the substrate, wherein the wiring includes a section that does not overlap the reinforcing member when viewed along the normal direction of the first surface and that has a meandering shape section including pluralities of peaks and valleys aligned along a planar direction of the first surface of the substrate.

In a wiring board according to one embodiment of the present disclosure, the reinforcing member may further include a second reinforcing part positioned between two of the wiring when viewed along than the normal direction of the first surface.

The wiring board according to one embodiment of the present disclosure may further comprise an electrode pad being electrically connected to the wiring or electrically connected to the electronic component mounted on the wiring board. In this case, the reinforcing member may further include a third reinforcing part overlapping the electrode pad when viewed along the normal direction of the first surface.

In a wiring board according to one embodiment of the present disclosure, the amplitude of the meandering shape section of the wiring may be 1 μm or more.

In a wiring board according to one embodiment of the present disclosure, the amplitude of the peaks and the valleys on the second surface of the substrate may be smaller than the amplitude of peaks and valleys on the first surface of the substrate. For example, the amplitude of peaks and the valleys on the second surface may be a 0.9 multiple or less or may be a 0.8 multiple or less of the amplitude of the peaks and the valleys on the first surface. The peaks and the valleys on the second surface appear in a section overlapping the meandering shape section. The peaks and the valleys on the first surface appear in a section overlapping the meandering shape section.

In a wiring board according to one embodiment of the present disclosure, the periodicity of peaks and valleys on the second surface of the substrate may be greater than the periodicity of the peaks and the valleys on the first surface of the substrate. For example, the periodicity of peaks and the valleys on the second surface may be a 1.1 multiple or more or may be a 1.2 multiple or more of the periodicity of the peaks and the valleys on the first surface. The peaks and the valleys on the second surface appear in a section overlapping the meandering shape section. The peaks and the valleys on the first surface appear in a section overlapping the meandering shape section.

In a wiring board according to one embodiment of the present disclosure, when the periodicity of peaks and valleys on the first surface of the substrate is F, the positions of peaks and valleys on the second surface of the substrate may be displaced from the positions of the peaks and the valleys on the first surface of the substrate. For example, the positions of the peaks and the valleys on the second surface may be displaced by 0.1×F or more from the positions of the peaks and the valleys on the first surface. The peaks and the valleys on the second surface appear in a section overlapping the meandering shape section. The peaks and the valleys on the first surface appear in a section overlapping the meandering shape section.

In a wiring board according to one embodiment of the present disclosure, when a resistance value of the wiring in a first state in which tensile stress along a planar direction of the first surface of the substrate is not applied to the substrate is referred to as the first resistance value and a resistance value of the wiring in a second state in which tensile stress is applied to the substrate such that the substrate is extended by 30% in comparison with the first state in the planar direction of the first surface is referred to as the second resistance value, the ratio of the absolute value of the difference between the first resistance value and the second resistance value to the first resistance value may be 20% or less.

The wiring board according to one embodiment of the present disclosure may further comprise a support substrate that is positioned between the wiring and the first surface of the substrate, that has a third elastic modulus greater than the first elastic modulus, and that supports the wiring.

In a wiring board according to one embodiment of the present disclosure, the reinforcing member may be positioned on the second surface side of the substrate.

In a wiring board according to one embodiment of the present disclosure, the reinforcing member may be positioned between the first surface of the substrate and the electronic component mounted on the wiring board.

In a wiring board according to one embodiment of the present disclosure, the reinforcing member may be positioned on the second surface side of the substrate or between the first surface of the substrate and the electronic component mounted on the wiring board.

In a wiring board according to one embodiment of the present disclosure, the reinforcing member may be positioned on the second surface side of the substrate, and the wiring may be positioned on the first surface of the substrate.

In a wiring board according to one embodiment of the present disclosure, the substrate may contain a silicone rubber.

In a wiring board according to one embodiment of the present disclosure, the reinforcing member may include a metallic layer.

In a wiring board according to one embodiment of the present disclosure, the wiring may include a plurality of conductive particles.

The wiring board according to one embodiment of the present disclosure may further comprise the electronic component positioned on the first surface side of the substrate and having the electrode which is electrically connected to the wiring.

One embodiment of the present disclosure is a method for manufacturing a wiring board, the method comprising: a first step of applying tensile stress to a substrate so as to extend the substrate, the substrate having a first elastic modulus that includes a first surface, and a second surface positioned on the opposite side of the first surface; a second step of providing wiring on the first surface side of the substrate which is in the extended state; and a third step of removing the tensile stress from the substrate, wherein the wiring board is provided with a reinforcing member having a second elastic modulus greater than the first elastic modulus, the reinforcing member at least including a first reinforcing part positioned on the first surface side of the substrate or on the second surface side of the substrate, and wherein, after the tensile stress has been removed from the substrate, the wiring includes a section that does not overlap the reinforcing member when viewed along the normal direction of the first surface and that has a meandering shape section including pluralities of peaks and valleys aligned along a planar direction of the first surface of the substrate.

The method for manufacturing a wiring board according to one embodiment of the present disclosure may further comprise: a substrate preparation step of providing the reinforcing member on the second surface of the substrate; and a support substrate preparation step of preparing a support substrate including a first surface and a second surface positioned on the opposite side of the first surface and providing the wiring on the first surface of the support substrate, the support substrate having a third elastic modulus greater than the first elastic modulus, wherein, in the second step, the second surface side of the support substrate being provided with the wiring may be bonded to the first surface of the substrate being provided with the reinforcing member and being in the extended state.

The method for manufacturing a wiring board according to one embodiment of the present disclosure may further comprise: a support substrate preparation step of preparing a support substrate including a first surface and a second surface positioned on the opposite side of the first surface, providing the wiring on the first surface of the support substrate, and providing the reinforcing member on the second surface of the support substrate, the support substrate having a third elastic modulus greater than the first elastic modulus, wherein, in the second step, the second surface side of the support substrate being provided with the wiring and the reinforcing member may be bonded to the first surface of the substrate being in the extended state.

The method for manufacturing a wiring board according to one embodiment of the present disclosure may further comprise: a substrate preparation step of providing the reinforcing member on the second surface of the substrate; and a support substrate preparation step of preparing a support substrate including a first surface and a second surface positioned on the opposite side of the first surface, providing the wiring on the first surface of the support substrate, and further providing the reinforcing member on the second surface of the support substrate, the support substrate having a third elastic modulus greater than the first elastic modulus, wherein, in the second step, the second surface side of the support substrate being provided with the wiring and the reinforcing member may be bonded to the first surface of the substrate being provided with the reinforcing member and being in the extended state.

The method for manufacturing a wiring board according to one embodiment of the present disclosure may further comprise: a substrate preparation step of providing the reinforcing member on the second surface of the substrate, wherein, in the second step, wiring that is connected to the electrode of the electronic component mounted on the wiring board may be provided on the first surface side of the substrate which is in the extended state and on the second surface of which the reinforcing member is provided.

According to the embodiment of the present disclosure, it is possible to suppress defects in the wiring board caused by extension and contraction of the substrate.

DESCRIPTION OF EMBODIMENTS

Figure 1:
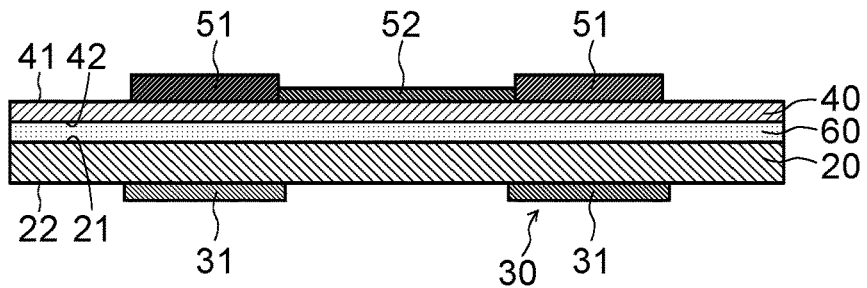
FIG. 1 is a cross-sectional view illustrating a wiring board according to a first embodiment.

A configuration of a wiring board according to the embodiment of the present disclosure and a method for manufacturing the same will be described in detail hereinbelow with reference to the drawings. Note that the embodiments indicated hereinbelow are an example of the embodiment of the present disclosure and that the present disclosure should not be interpreted as being limited to or by such embodiments. Furthermore, in the present specification, terminology such as "board", "substrate", "sheet" and "film" are not distinguished only on the basis of term distinctions. For example, "substrate" is a concept that also includes members like those that may be referred to as boards, sheets, and films. Furthermore, it is assumed that length and angle values and terms such as "parallel" or "orthogonal", for example, which specify shape and geometric conditions as well as their degree, as used in this specification, are not bound by strict meanings and are interpreted to include a scope within which similar functions are to be expected. Moreover, the same or similar reference signs are assigned to the same parts or to parts with similar functions in the drawings referred to in the present embodiment, and repetitious descriptions of such parts are sometimes omitted. In addition, there may be cases where the dimensional ratios in the drawings differ from the actual ratios for the sake of convenience in the description and cases where parts of configurations are omitted from the drawings.

A first embodiment of the present disclosure will be described hereinbelow with reference to FIGS. 1 to 7.

(Wiring Board)

Figure 2:
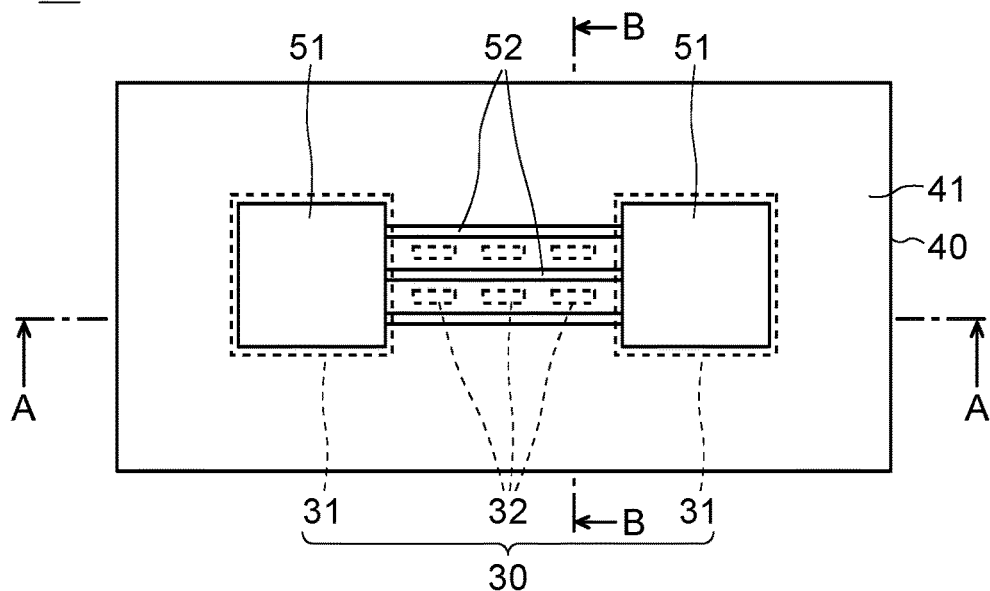
FIG. 2 is a plan view illustrating a wiring board according to the first embodiment.

First, a wiring board 10 according to the present embodiment will be described. FIGS. 1 and 2 are a cross-sectional view and a plan view, respectively, illustrating the wiring board 10. The cross-sectional view illustrated in FIG. 1 is a diagram for a case in which the wiring board 10 of FIG. 2 is cut along a line A-A.

The wiring board 10 illustrated in FIG. 1 comprises a substrate 20, a reinforcing member 30, a support substrate 40, an electronic component 51, and wiring 52. The constituent elements of the wiring board 10 will be described hereinbelow.

[Substrate]

The substrate 20 is a member that is configured to be stretchable. The substrate 20 includes a first surface 21 positioned on the side of the electronic component 51 and the wiring 52, and a second surface 22 positioned on the opposite side of the first surface 21. The thickness of the substrate 20 is, for example, 10 mm or less, and more preferably 1 mm or less. By affording the substrate 20 small thickness, the force required to stretch the substrate 20 can be reduced. Furthermore, by affording the substrate 20 small thickness, the thickness of the whole product using the wiring board 10 can be made small. Thus, for example, when the product using the wiring board 10 is a sensor which is attached to a body part such as a person's arm, for example, the wearing sensation can be reduced. The thickness of the substrate 20 may be 10 μm or more.

Possible examples of parameters representing the stretchability of the substrate 20 include the elastic modulus of the substrate 20. The elastic modulus of the substrate 20 is, for example, 10 MPa or less and more preferably 1 MPa or less. By using a substrate 20 with such an elastic modulus, the whole of the wiring board 10 can be made stretchable. The elastic modulus of the substrate 20 is also referred to as the first elastic modulus in the following description. The first elastic modulus of the substrate 20 may be 1 kPa or more.

As a method for calculating the first elastic modulus of the substrate 20, a method in which tensile testing is carried out in conformance with JIS K6251 by using a sample of the substrate 20 may be adopted. Furthermore, a method in which the elastic modulus of the sample of the substrate 20 is measured using nanoindentation in conformance with ISO 14577 may also be adopted. A nano indenter may be employed as the measuring instrument used in the nanoindentation. Conceivable methods for preparing the sample of the substrate 20 include a method in which a portion of the substrate 20 is removed as a sample from the wiring board 10 and a method in which a portion of the substrate 20 before the wiring board 10 is constituted is removed as a sample. In addition to such methods, as a method for calculating the first elastic modulus of the substrate 20, a method in which the material constituting the substrate 20 is analyzed and the first elastic modulus of the substrate 20 is calculated on the basis of an existing database of materials may also be adopted. Note that the elastic modulus of the present application is an elastic modulus in an environment of 25° C.

Other examples of parameters representing the stretchability of the substrate 20 may include the bending rigidity of the substrate 20. The bending rigidity is the product of the second moment of area of the member of interest and the elastic modulus of the material constituting the member of interest, and the units of the bending rigidity are $N \cdot m^2$ or $Pa \cdot m^4$. The second moment of area of the substrate 20 is calculated on the basis of the cross-section when the section of the substrate 20 that overlaps the wiring 52 is cut according to a plane orthogonal to the stretching direction of the wiring board 10. In the description hereinbelow, the bending rigidity of the substrate 20 is also referred to as the first bending rigidity.

Examples of the material constituting the substrate 20 may include thermoplastic elastomers, silicone rubber, urethane gels, and silicon gels, and the like. Furthermore, as the material of the substrate 20, cloth such as woven fabric, knitted fabric, or nonwoven fabric, for example, may also be used. Thermoplastic elastomers that can be used include polyurethane-based elastomers, styrene-based thermoplastic elastomers, olefin-based thermoplastic elastomers, vinyl chloride-based thermoplastic elastomers, ester-based thermoplastic elastomers, amide-based thermoplastic elastomers, 1,2-BR thermoplastic elastomers, fluorine-based thermoplastic elastomers, and the like. When mechanical strength and wear resistance are considered, urethane-based elastomers are preferably employed. Furthermore, silicone rubber exhibits superior heat resistance, chemical resistance, and incombustibility and is preferable as the material of the substrate 20.

[Reinforcing Member]

The reinforcing member 30 is a member that is provided on the wiring board 10 in order to control the extension and contraction of the substrate 20. In the example illustrated in FIG. 1, the reinforcing member 30 is positioned on the second surface 22 side of the substrate 20. For example, the reinforcing member 30 is provided on the second surface 22 of the substrate 20.

The reinforcing member 30 has an elastic modulus greater than the first elastic modulus of the substrate 20. The elastic modulus of the reinforcing member 30 is, for example, 1 GPa or more, and more preferably 10 GPa or more. The elastic modulus of the reinforcing member 30 may be 100 times or more the first elastic modulus of the substrate 20 or may be 1000 times or more the first elastic modulus of the substrate 20. By providing this reinforcing member 30 on the substrate 20, extension and contraction of the section of the substrate 20 which overlaps the reinforcing member 30 can be suppressed. Thus, the substrate 20 can be divided into a section in which extension and contraction occur readily and a section in which extension and contraction does not readily occur. In the description hereinbelow, the elastic modulus of the reinforcing member 30 is also referred to as the second elastic modulus. The second elastic modulus of the reinforcing member 30 may also be 500 GPa or less. Furthermore, the second elastic modulus of the reinforcing member 30 may be 500000 times or less the first elastic modulus of the substrate 20. Note that "overlapping" means that two constituent elements overlap each other when viewed along the normal direction of the first surface 21 of the substrate 20.

The method for calculating the second elastic modulus of the reinforcing member 30 is suitably decided according to the form of the reinforcing member 30. For example, the method for calculating the second elastic modulus of the reinforcing member 30 may be the same as or may be different from the foregoing method for calculating the elastic modulus of the substrate 20. A method for calculating the elastic modulus of a support substrate 40, described subsequently, may also be the same as or may be different from the foregoing method for calculating the elastic modulus of the substrate 20. For example, as a method for calculating the elastic modulus of the reinforcing member 30 or the support substrate 40, a method in which tensile testing is carried out in conformance with ASTM D882 by using a sample of the reinforcing member 30 or the support substrate 40 may be adopted.

The reinforcing member 30 has a bending rigidity greater than the first bending rigidity of the substrate 20. The bending rigidity of the reinforcing member 30 may be 100 times or more the first bending rigidity of the substrate 20 or may be 1000 times or more the first bending rigidity of the substrate 20. In the description hereinbelow, the bending rigidity of the reinforcing member 30 is also referred to as the second bending rigidity.

Examples of the material constituting the reinforcing member 30 include metal layers containing metallic material, general thermoplastic elastomers, acrylic-based, urethane-based, epoxy-based, polyester-based, vinyl ether-based, polyene thiol-based, and silicone-based oligomers and polymers, and the like. Possible examples of the metallic material include copper, aluminum, and stainless steel, and the like. The thickness of the reinforcing member 30 is 10 μm or more, for example. Among the foregoing materials, the metallic layer more preferably has a large elastic modulus and enables micromachining by means of etching or the like.

In cases where an oligomer or a polymer is used as the material constituting the reinforcing member 30, the reinforcing member 30 may be transparent. Moreover, the reinforcing member 30 may have light blocking properties, such as the characteristic of blocking ultra-violet waves, for example. For example, the reinforcing member 30 may be black. The color of the reinforcing member 30 and the color of the substrate 20 may also be the same.

Figure 3:
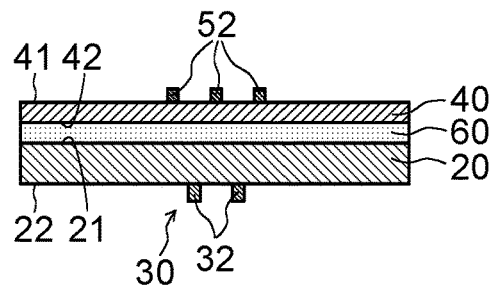
FIG. 3 is a cross-sectional view illustrating a case where the wiring board of FIG. 2 is cut along a line B-B.

As illustrated in FIG. 1, the reinforcing member 30 at least includes a first reinforcing part 31. As illustrated in FIGS. 2 and 3, the reinforcing member 30 may further include a second reinforcing part 32. FIG. 3 is a cross-sectional view illustrating a case where the wiring board 10 of FIG. 2 is cut along a line B-B. The first reinforcing part 31 and second reinforcing part 32 will be described in detail subsequently on the basis of the positional relationship between the electronic component 51 and the wiring 52. Note that, FIG. 2 is a plan view illustrating a case where the wiring board 10 is viewed from the first surface 21 side of the substrate 20, and therefore the reinforcing member 30 positioned on the second surface 22 side of the substrate 20 is denoted by a dotted line.

[Support Substrate]

Figure 18A:
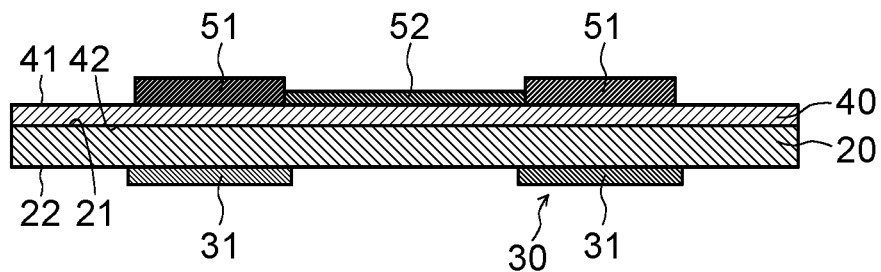
FIG. 18A is a cross-sectional view illustrating a wiring board according to a modification example.
Figure 18B:
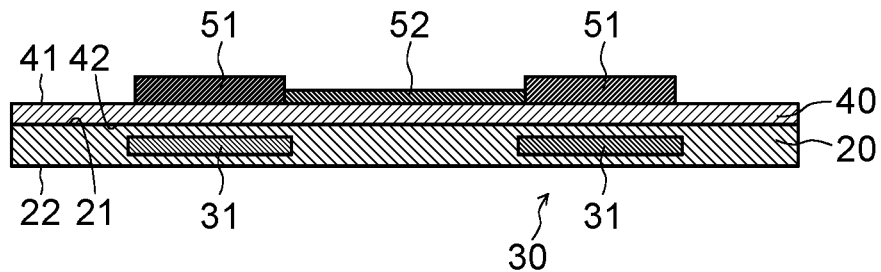
FIG. 18B is a cross-sectional view illustrating a wiring board according to a modification example.

The support substrate 40 is a plate-like member that is configured to have a lower stretchability than the substrate 20. The support substrate 40 includes a second surface 42 positioned on the substrate 20 side and a first surface 41 positioned on the opposite side of the second surface 42. In the example illustrated in FIG. 1, the support substrate 40 supports the electronic component 51 and the wiring 52 on the first surface 41 side. The support substrate 40 is bonded to the first surface of the substrate 20 on the second surface 42 side. For example, an adhesive layer 60 that contains an adhesive may be provided between the substrate 20 and support substrate 40. An acrylic-based adhesive or silicone-based adhesive, or the like, for example, can be used as the material constituting the adhesive layer 60. The thickness of the adhesive layer 60 is, for example, 5 μm or more and 200 μm or less. Furthermore, as illustrated in FIG. 18A, the second surface 42 of the support substrate 40 may be bonded to the first surface 21 of the substrate 20 by means of a normal-temperature bonding or molecular bonding. In this case, an adhesive layer need not be provided between the substrate 20 and the support substrate 40. In addition, a plasma layer for improving the adhesive properties of normal-temperature bonding and molecular bonding may be provided for the first surface 21 of the substrate 20 and/or the second surface 42 of the support substrate 40. In a case where the second surface 42 of the support substrate 40 is bonded to the first surface 21 of the substrate 20 by means of normal-temperature bonding or molecular bonding, the first reinforcing part 31 is preferably embedded in the substrate 20 so as not to be exposed to the first surface 21 or second surface 22 of the substrate 20, as illustrated in FIG. 18B.

As will be described subsequently, when tensile stress is removed from the substrate 20 bonded to the support substrate 40 and the substrate 20 contracts, a meandering shape section is formed in the support substrate 40. The characteristics and dimensions of the support substrate 40 are configured such that this meandering shape section is easily formed. For example, the support substrate 40 has an elastic modulus greater than the first elastic modulus of the substrate 20. In the description hereinbelow, the elastic modulus of the support substrate 40 is sometimes also referred to as the third elastic modulus.

The third elastic modulus of the support substrate 40 is, for example, 100 MPa or more and more preferably 1 GPa or more. The third elastic modulus of the support substrate 40 may be 100 times or more the first elastic modulus of the substrate 20 or may be 1000 times or more the first elastic modulus of the substrate 20. Further, the thickness of the support substrate 40 is, for example, 10 μm or less and, more preferably, 5 μm or less. By configuring the elastic modulus of the support substrate 40 to be high and the thickness of the support substrate 40 to be small, the meandering shape section is readily formed in the support substrate 40 as the substrate 20 contracts. Polyethylene naphthalate, polyimides, polycarbonates, acrylic resins, or polyethylene terephthalate, or the like, for example, can be used as the material constituting the support substrate 40.

The third elastic modulus of the support substrate 40 may be 100 times or less the first elastic modulus of the substrate 20. The method for calculating the third elastic modulus of the support substrate 40 is the same as the case of the substrate 20. Furthermore, the thickness of the support substrate 40 may be 500 nm or more.

[Electronic Component]

In the example illustrated in FIG. 1, the electronic component 51 at least has an electrode that is connected to the wiring 52. The electronic component 51 may be an active component, may be a passive component, or may be a mechanical component.

Possible examples of the electronic component 51 include transistors, LSI (Large Scale Integration), MEMS (Micro Electro Mechanical Systems), relays, light-emitting devices such as LEDs, OLEDs, and LCDs, sensors, sound-emitting components such as buzzers, vibrating components that emit vibration, cooling/heating components such as Peltier devices or heating wires that control cooling/heat generation, resistors, capacitors, inductors, piezoelectric elements, switches, connectors, and the like. Among the foregoing examples of the electronic component 51, a sensor is preferably used. Possible examples of the sensors include, for example, temperature sensors, pressure sensors, light sensors, photoelectric sensors, proximity sensors, shear force sensors, biometric sensors, laser sensors, microwave sensors, humidity sensors, distortion sensors, gyro sensors, acceleration sensors, displacement sensors, magnetic sensors, gas sensors, GPS sensors, ultrasonic sensors, odor sensors, brain wave sensors, current sensors, oscillation sensors, pulse wave sensors, electrocardiogram sensors, and luminosity sensors. Among these sensors, a biometric sensor is particularly preferable. A biometric sensor is capable of measuring biological information such as heart rate, pulse, electrocardiogram, blood pressure, body temperature, blood oxygen concentration, and so forth.

[Wiring]

The wiring 52 is an electrically conductive member that is connected to the electrodes of the electronic component 51. For example, as illustrated in FIG. 2, one end and the other end of the wiring 52 are connected to the electrodes of two electronic components 51, respectively. As illustrated in FIG. 2, a plurality of wirings 52 may be provided between the two electronic components 51.

As will be described subsequently, when tensile stress is removed from the substrate 20 bonded to the support substrate 40 and the substrate 20 contracts, the wiring 52 deforms in a meandering shape. In view of the foregoing, the wiring 52 is preferably provided with a structure that is durable to deformation. For example, the wiring 52 has a base raw material and a plurality of conductive particles dispersed within the base raw material. In this case, by using a deformable material such as a resin as the base raw material, the wiring 52 is also capable of deforming according to the extension and contraction of the substrate 20. Furthermore, by configuring the distribution and shape of the conductive particles such that contact between the plurality of conductive particles is maintained even when deformation occurs, the conductive properties of the wiring 52 can be maintained.

General thermoplastic elastomers and thermoset elastomers, for example, can be used as the material constituting the base raw material of the wiring 52, and examples that can be used include styrene-based elastomers, acrylic-based elastomers, olefin-based elastomers, urethane-based elastomers, silicone rubbers, urethane rubber, fluorine rubber, nitrile rubber, polybutadiene, and polychloroprene. Of these, resins and rubbers containing urethane-based and silicone-based structures are preferably used from the perspective of stretchability and durability, and so forth. In addition, particles of silver, copper, gold, nickel, palladium, platinum, and carbon, and the like, for example, can be used as the material constituting the conductive particles of the wiring 52. Of these, silver particles are preferably used from the perspective of cost and conductivity.

Note that the material determined as the wiring 52 accommodate the extension and contraction of the substrate 20 by utilizing the elimination and generation of the meandering shape section 57. In view of the foregoing, as the material of the wiring 52, not only materials that are deformable and stretchable per se as outlined hereinabove but also materials that are not deformable or stretchable per se may be adopted.

Possible materials which are not stretchable per se and may be used for the wiring 52 include, for example, metals such as gold, silver, copper, aluminum, platinum, or chromium and alloys containing such metals. When the material of the wiring 52 is not stretchable per se, a metal layer may be used as the wiring 52.

The thickness of the wiring 52 is smaller than the thickness of the electronic component 51 and is 50 µm or less, for example. The width of the wiring 52 is 50 µm or more and 10 mm or less, for example.

[First Reinforcing Part and Second Reinforcing Part of Reinforcing Member]

Next, the first reinforcing part 31 and second reinforcing part 32 of the reinforcing member 30 will be described on the basis of the positional relationship between the electronic component 51 and the wiring 52.

First, the first reinforcing part 31 will be described. As illustrated in FIGS. 1 and 2, the first reinforcing part 31 is disposed so as to at least partially overlap the electronic component 51 when viewed along the normal direction of the first surface 21 of the substrate 20. The first reinforcing part 31 preferably overlaps the electronic component 51 across the whole area of the electronic component 51 when viewed along the normal direction of the first surface 21 of the substrate 20. Hence, the section of the substrate 20 which overlaps the electronic component 51, that is, the section overlapping the first reinforcing part 31 does not readily deform in comparison with the section of the substrate 20 which does not overlap the reinforcing member 30. Thus, when a force such as tensile stress is applied to the substrate 20, or when a force such as tensile stress is removed from the substrate 20, and so forth, the occurrence of deformation in the section of the substrate 20 overlapping the electronic component 51 can be suppressed. It is accordingly possible to restrain stress caused by deformation of the substrate 20 from acting on the electronic component 51 and to suppress deformation of and damage to the electronic component 51.

In addition, damage to the electrical junction between the electronic component 51 and the wiring 52 can be suppressed.

Figure 19:
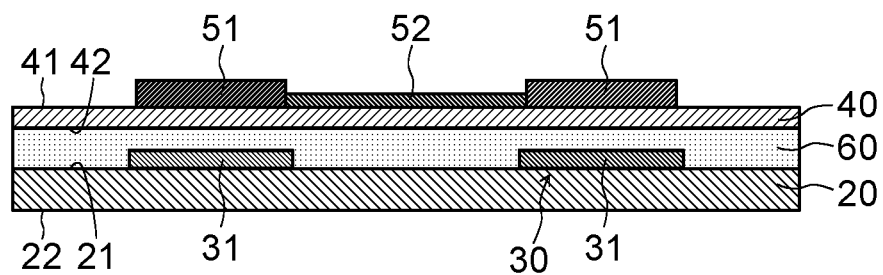
FIG. 19 is a cross-sectional view illustrating a wiring board according to a modification example.

Note that, although the example in which the first reinforcing part 31 is positioned on the second surface 22 of the substrate 20 is illustrated in FIG. 1, the position of the first reinforcing part 31 is optional. As illustrated in FIG. 19, for example, the first reinforcing part 31 may also be positioned on the first surface 21 of the substrate 20.

Next, the second reinforcing part 32 will be described. As illustrated in FIGS. 2 and 3, the second reinforcing part 32 is positioned between two wirings 52 when viewed along the normal direction of the first surface. It is thus possible to suppress deformation of the section of the substrate 20 which is positioned between two wirings 52 when viewed along the normal direction of the first surface. It is thus possible to restrain an electrical short circuit from occurring between the two wirings 52 when the interval between the wirings 52 is shortened due to deformation of the substrate 20.

In the example illustrated in FIG. 2, a plurality of second reinforcing parts 32 are intermittently arranged along the direction of extension of the wiring 52. Although not illustrated, one second reinforcing part 32 that extends continuously along the wiring 52 may be provided between two wirings 52.

[Structure of Wiring]

Figure 4:
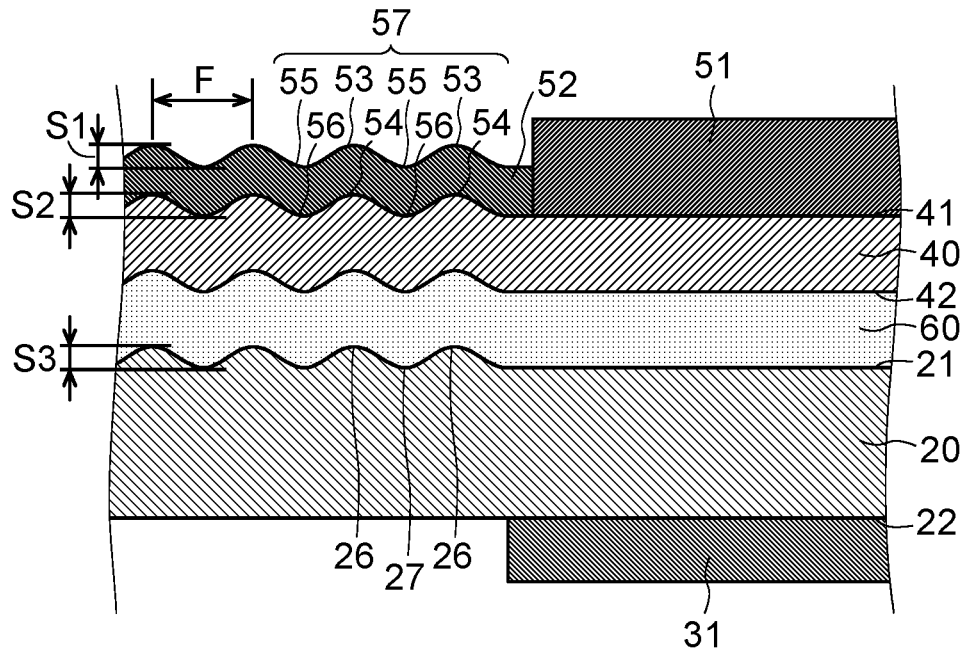
FIG. 4 is a cross-sectional view illustrating an enlargement of an example of wiring of the wiring board illustrated in FIG. 1, and peripheral constituent elements thereof.

Next, the cross section structure of the wiring 52 will be described in detail with reference to FIG. 4. FIG. 4 is a cross-sectional view illustrating an enlargement of an example of the wiring 52 of the wiring board 10 illustrated in FIG. 1, and peripheral constituent elements thereof.

As illustrated in FIGS. 1 to 3, the whole of the wiring 52 or the majority of the wiring 52 is arranged so as not to overlap the reinforcing member 30 that includes the first reinforcing part 31 and the second reinforcing part 32, or the like. Hence, when deformation such as contraction occurs in the substrate 20, the wiring 52 readily deforms as the substrate 20 deforms. For example, when the substrate 20 is relaxed after the wiring 52 has been provided on the substrate 20 which is in an extended state, the meandering shape section 57 is generated in the section of the wiring 52 which does not overlap the reinforcing member 30, as illustrated in FIG. 4.

The meandering shape section 57 includes peaks and valleys in the normal direction of the first surface 21 of the substrate 20. In FIG. 4, a reference sign 53 denotes a peak that appears in a front face of the wiring 52, and a reference sign 54 denotes a peak that appears in a back face of the wiring 52. Furthermore, a reference sign 55 denotes a valley that appears in the front face of the wiring 52, and a reference sign 56 denotes a valley that appears in the back face of the wiring 52. The front face is one surface of the wiring 52 far from the substrate 20, while the back face is the other surface of the wiring 52 close to the substrate. Furthermore, in FIG. 4, reference signs 26 and 27 denote peaks and valleys that appear in the first surface 21 of the substrate 20. As a result of the deformation of the substrate 20 such that peaks 26 and valleys 27 appear in the first surface 21, the wiring 52 is deformed in a meandering shape so as to have the meandering shape section 57. The peaks 26 of the first surface 21 of the substrate 20 correspond to the peaks 53 and 54 of the meandering shape section 57 of the wiring 52, and the valleys 27 of the first surface 21 of the substrate 20 correspond to the valleys 55 and 56 of the meandering shape section 57 of the wiring 52.

The peaks 53 and 54 and valleys 55 and 56 appear repeatedly along a planar direction of the first surface 21 of the substrate 20. A periodicity F with which the peaks 53 and 54 and valleys 55 and 56 appear repeatedly is 10 μm or more and 100 mm or less, for example. Note that, although the example in which the pluralities of peaks and valleys of the meandering shape section 57 are aligned with a constant periodicity is illustrated in FIG. 4, the present disclosure is not limited to or by this example. Although not illustrated, the pluralities of peaks and valleys of the meandering shape section 57 may also be aligned irregularly along the planar direction of the first surface 21. For example, the interval between two adjacent peaks in the planar direction of the first surface 21 need not be constant.

In FIG. 4, a reference sign S1 denotes the amplitude of the meandering shape section 57 in the front face of the wiring 52. The amplitude S1 is, for example, 1 μm or more and, more preferably, 10 μm or more. By setting the amplitude S1 at 10 μm or more, the wiring 52 readily deforms so as to accommodate the extension of the substrate 20. The amplitude S1 may also be 500 μm or less, for example.

The amplitude S1 is calculated by measuring the distances, in the normal direction of the first surface 21, between adjacent peaks 53 and valleys 55 across a certain range in the longitudinal direction of the wiring 52 and finding the average of such distances, for example. The "certain range in the longitudinal direction of the wiring 52" is 10 mm, for example. As the measuring instrument for measuring the distances between the adjacent peaks 53 and valleys 55, a non-contact-type measuring instrument that uses a laser microscope or the like, or a contact-type measuring instrument may be used. Furthermore, the distances between adjacent peaks 53 and valleys 55 may also be measured on the basis of images such as cross-section photographs. The method for calculating the amplitudes S2, S3, and S4, described subsequently, is also the same.

In FIG. 4, a reference sign S2 denotes the amplitude of the meandering shape section 57 at the back face of the wiring 52. Like amplitude S1, amplitude S2 is, for example, 1 μm or more and, more preferably, 10 μm or more. The amplitude S2 may also be 500 μm or less, for example.

As illustrated in FIG. 4, the same meandering shape section as in the wiring 52 may also be formed in the support substrate 40, the adhesive layer 60, and the first surface 21 of the substrate 20. In FIG. 4, a reference sign S3 denotes the amplitude of the meandering shape section in the first surface 21 of the substrate 20. The meandering shape section in the first surface 21 includes pluralities of peaks 26 and valleys 27. The amplitude S3 is, for example, 1 μm or more and, more preferably, 10 μm or more. The amplitude S3 may also be 500 μm or less, for example.

Figure 5A:
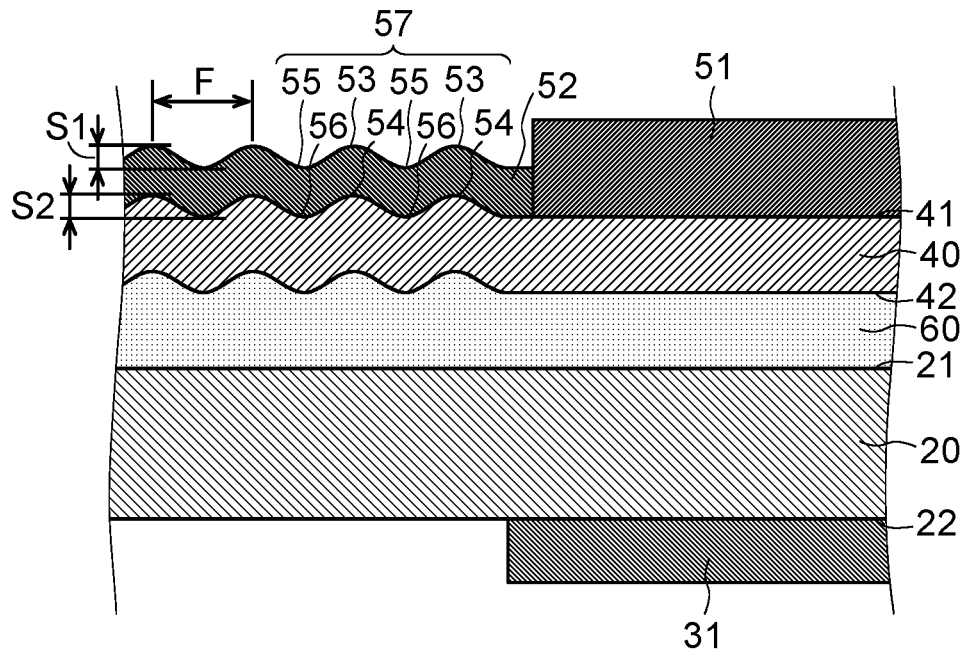
FIG. 5A is a cross-sectional view illustrating an enlargement of another example of wiring of the wiring board illustrated in FIG. 1, and peripheral constituent elements thereof.

FIG. 5A is a cross-sectional view illustrating an enlargement of another example of wiring 52 of the wiring board 10 illustrated in FIG. 1, and peripheral constituent elements thereof. As illustrated in FIG. 5A, the meandering shape section need not be formed in the first surface 21 of the substrate 20.

Figure 5B:
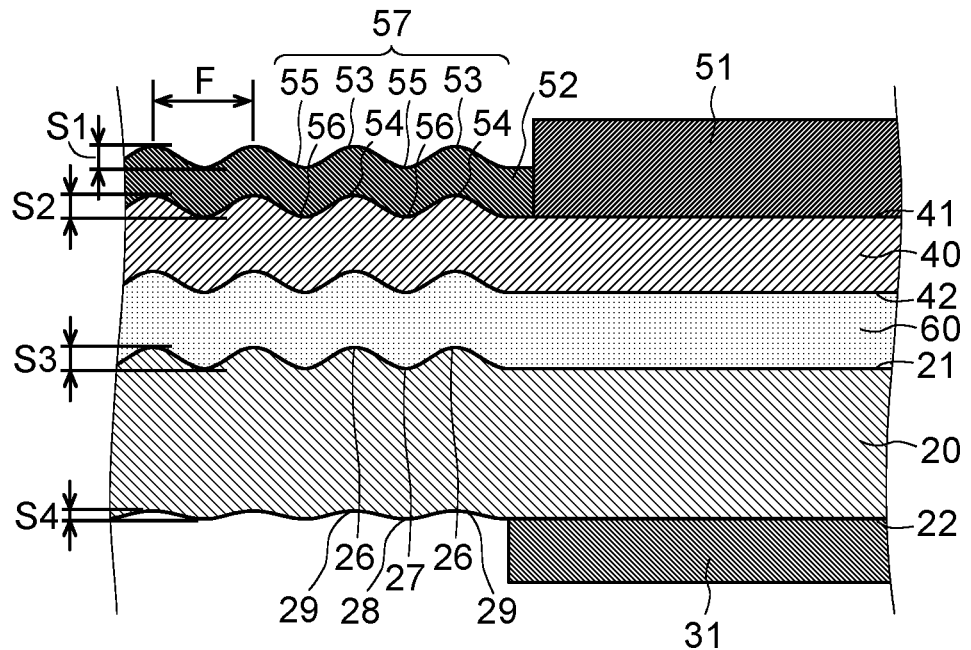
FIG. 5B is a cross-sectional view illustrating an enlargement of another example of wiring of the wiring board illustrated in FIG. 1, and peripheral constituent elements thereof.

FIG. 5B is a cross-sectional view illustrating an enlargement of another example of the wiring 52 of the wiring board 10 illustrated in FIG. 1, and peripheral constituent elements thereof. As illustrated in FIG. 5B, the meandering shape section may be formed not only in the first surface 21 of the substrate 20 but also in the second surface 22. The meandering shape section in the second surface 22 includes pluralities of peaks 28 and valleys 29. In the example illustrated in FIG. 5B, the peak 28 of the second surface 22 appears in a position overlapping the valley 27 of the first surface 21, and the valleys 29 of the second surface 22 appear in positions overlapping the peaks 26 of the first surface 21. Note that, although not illustrated, the positions in which the peak 28 and the valleys 29 of the second surface 22 of the substrate 20 need not overlap the valley 27 and the peaks 26 of the first surface 21. Furthermore, the quantity or periodicity of the peak 28 and the valleys 29 of the second surface 22 of the substrate 20 may be the same as or different from the quantity or periodicity of the peaks 26 and valley 27 of the first surface 21. For example, the periodicity of the peak 28 and valleys 29 of the second surface 22 of the substrate 20 may be greater than the periodicity of the peaks 26 and valley 27 of the first surface 21. In this case, the periodicity of the peak 28 and valleys 29 of the second surface 22 of the substrate 20 may be a 1.1 multiple or more of the periodicity of the peaks 26 and valley 27 of the first surface 21 or may be a 1.2 multiple or more thereof, a 1.5 multiple or more thereof, or a 2.0 multiple or more thereof. Note that "the periodicity of the peak 28 and valleys 29 of the second surface 22 of the substrate 20 may be greater than the periodicity of the peaks 26 and valley 27 of the first surface 21" is a concept that includes cases where the peaks and valleys do not appear in the second surface 22 of the substrate 20.

In FIG. 5B, a reference sign S4 denotes the amplitude of the peak 28 and valleys 29 that appear in the second surface 22 of the substrate 20. The amplitude S4 of the second surface 22 may be the same as or different from the amplitude S3 of the first surface 21. For example, the amplitude S4 of the second surface 22 may be smaller than the amplitude S3 of the first surface 21. For example, the amplitude S4 of the second surface 22 may be a 0.9 multiple or less of the amplitude S3 of the first surface 21, or may be a 0.8 multiple or less thereof, or a 0.6 multiple or less thereof. Furthermore, the amplitude S4 of the second surface 22 may be a 0.1 multiple or more of the amplitude S3 of the first surface 21, or may be a 0.2 multiple or more thereof. In cases where the thickness of the substrate 20 is small, the ratio of the amplitude S4 of the second surface 22 to the amplitude S3 of the first surface 21 easily becomes large. Note that "the amplitude of the peak 28 and valleys 29 of the second surface 22 of the substrate 20 is smaller than the amplitude of the peaks 26 and valley 27 of the first surface 21" is a concept that includes cases where the peaks and valleys do not appear in the second surface 22 of the substrate 20.

Figure 5C:
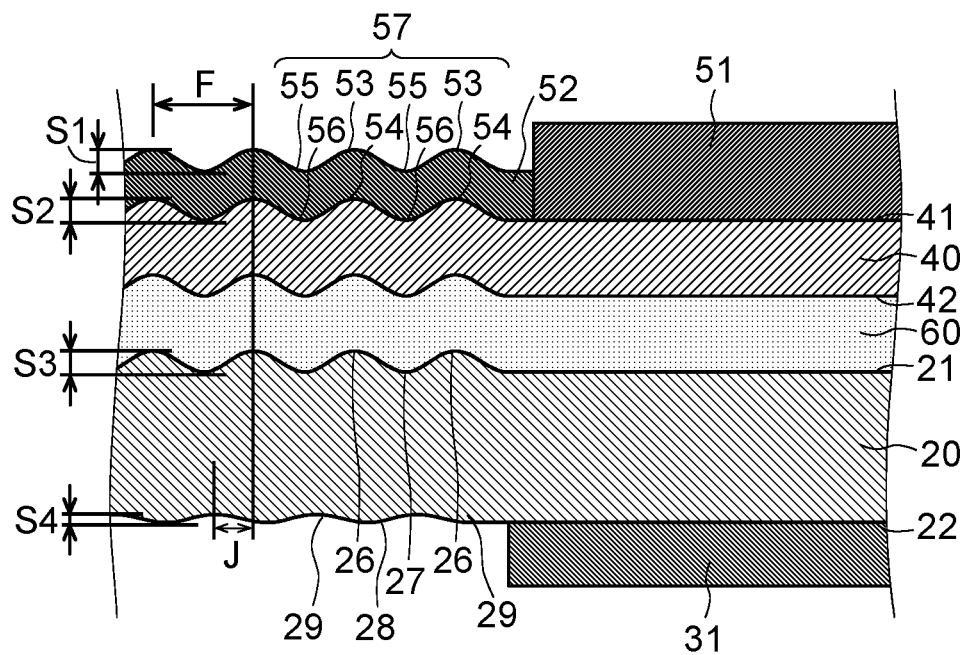
FIG. 5C is a cross-sectional view illustrating an enlargement of another example of wiring of the wiring board illustrated in FIG. 1, and peripheral constituent elements thereof.

Furthermore, the example in which the positions of the peaks 28 and valleys 29 of the second surface 22 match the positions of the valleys 27 and peaks 26 of the first surface 21 is illustrated in FIG. 5B, but the present disclosure is not limited to or by this example. As illustrated in FIG. 5C, the positions of the peaks 28 and valleys 29 of the second surface 22 may be displaced by J from the positions of the valleys 27 and peaks 26 of the first surface 21. The displacement amount J may, for example, be 0.1×F or more, or 0.2×F or more.

The benefit afforded by the meandering shape section 57 illustrated in FIGS. 4, 5A, 5B, and 5C being formed on the wiring 52 will now be described. As mentioned earlier, the substrate 20 has an elastic modulus of 10 MPa or less. Hence, when tensile stress is applied to the wiring board 10, the substrate 20 can be extended through elastic deformation. Here, conversely, when the wiring 52 is also similarly extended through elastic deformation, because the overall length of the wiring 52 increases and the cross-sectional surface area of the wiring 52 is reduced, the resistance value of the wiring 52 increases. Damage such as cracks in the wiring 52 due to the elastic deformation of the wiring 52 are also conceivable.

On the other hand, in the present embodiment, the wiring 52 has the meandering shape section 57. Hence, when the substrate 20 extends, because the wiring 52 deforms such that the undulations in the meandering shape section 57 are reduced, that is, as a result of the meandering shape being eliminated, the wiring 52 is capable of accommodating the extension of the substrate 20. Therefore, an increase in the overall length of the wiring 52 as well as a reduction in the cross-sectional surface area of the wiring 52 as the substrate 20 extends can be suppressed. An increase in the resistance value of the wiring 52 due to the extension of the wiring board 10 can thus be suppressed. In addition, the occurrence of damage such as cracks in the wiring 52 can be suppressed.

Figure 6:
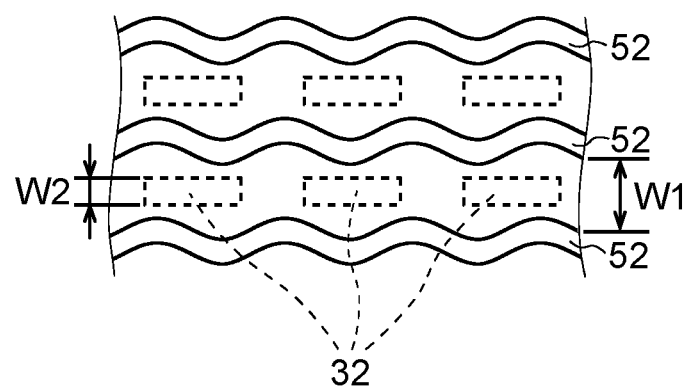
FIG. 6 is a plan view illustrating an enlargement of an example of wiring of the wiring board illustrated in FIG. 2, and peripheral constituent elements thereof.

Next, the planar structure of the wiring 52 will be described in detail with reference to FIG. 6. FIG. 6 is a plan view illustrating an enlargement of an example of the wiring 52 of the wiring board 10 illustrated in FIG. 1, and peripheral constituent elements thereof.

When the substrate 20 is relaxed after the wiring 52 has been provided on the substrate 20 which is in an extended state, the meandering shape section is sometimes formed in the wiring 52, as illustrated in FIG. 6, not only in the normal direction of the first surface 21 of the substrate 20 but also in the planar direction of the first surface 21. Also in this case, the second reinforcing part 32, which is positioned between the two wirings 52 when viewed along the normal direction of the first surface, is provided as mentioned earlier in the wiring board 10 according to the present embodiment. It is therefore possible to prevent an electrical short circuit from occurring between the two wirings 52 when the interval between the wirings 52 is shortened due to deformation of the substrate 20.

In FIG. 6, a reference sign W1 denotes the interval between the two wirings 52, and a reference sign W2 denotes the width of the second reinforcing part 32 in the direction in which the wirings 52 are aligned. The interval W1 is, for example, 5 µm or more and 500 µm or less. Furthermore, the width W2 is, for example, 10 µm or more and 1 mm or less.

(Method for Manufacturing Wiring Board)

A method for manufacturing the wiring board 10 will be described hereinbelow with reference to FIGS. 7(a) to 7(d).

Figure 7A:
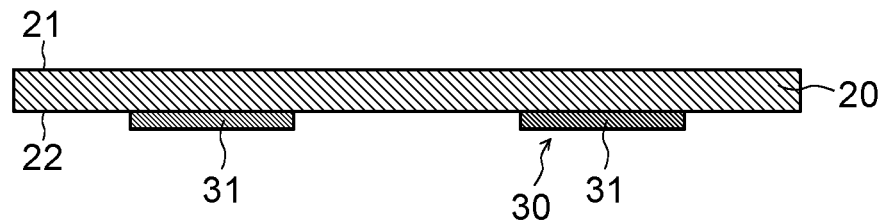
FIG. 7 is a diagram to illustrate a method for manufacturing the wiring board illustrated in FIG. 1.

First, a substrate preparation step in which the substrate 20 is prepared is carried out. In the present embodiment, in the substrate preparation process, the first reinforcing part 31 is provided on the second surface 22 of the substrate 20, as illustrated in FIG. 7(a). For example, first, a metallic layer is formed across the whole area of the second surface 22 of the substrate 20 and then the metallic layer is partially removed by means of etching or the like Thus, the reinforcing member 30, which has the first reinforcing part 31 that includes the metallic layer, can be formed. Although not illustrated, the second reinforcing part 32 may be formed on the second surface 22 of the substrate 20 at the same time as the first reinforcing part 31.

Figure 7B:
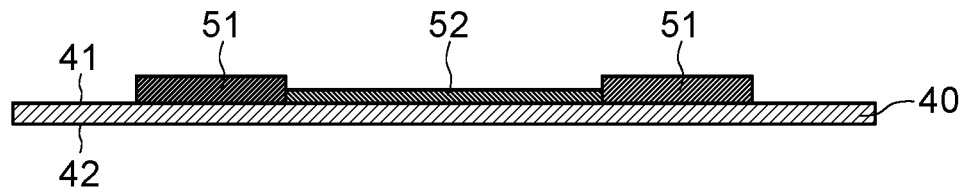

Furthermore, a support substrate preparation step of preparing the support substrate 40 is carried out. In the present embodiment, in the support substrate preparation process, the electronic component 51 and wiring 52 are provided on the first surface 41 of the support substrate 40, as illustrated in FIG. 7(b). As the method for providing the wiring 52, a method in which a conductive paste including a base raw material and conductive particles is printed on the first surface 41 of the support substrate 40 can be adopted, for example.

Next, a first step of extending the substrate 20 by applying a tensile stress T to the substrate 20 is implemented. The rate of extension of the substrate 20 is 10% or more and 200% or less, for example. The first step may be carried out in a state where the substrate 20 is heated or may be carried out at a normal temperature. When the substrate 20 is heated, the temperature of the substrate 20 is 50° C. or higher and 100° C. or lower, for example.

Figure 7C:
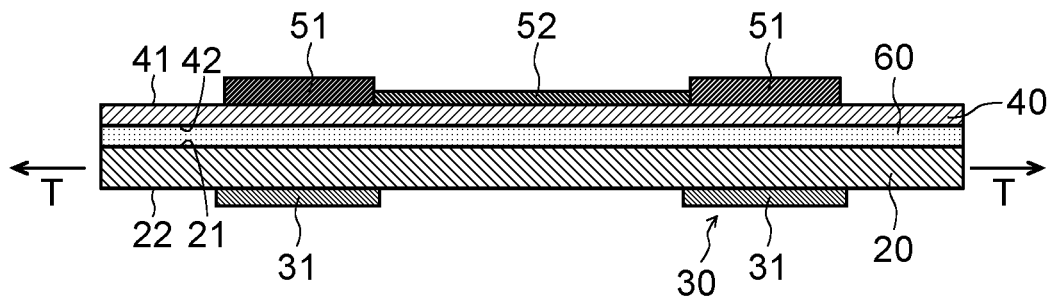
Figure 7D:
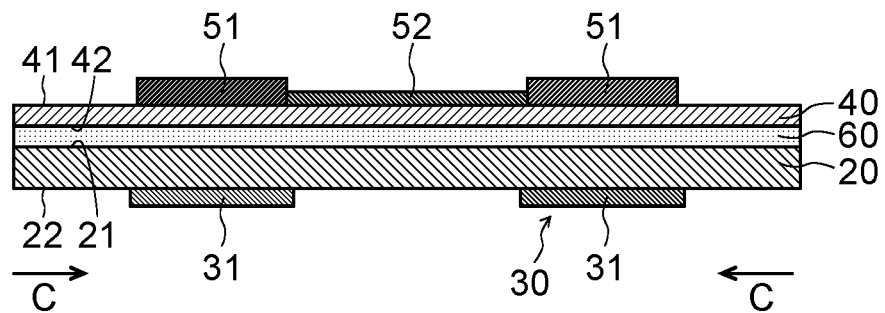

Thereafter, a second step of providing the electronic component 51 and wiring 52 on the first surface 21 side of the substrate 20, which is in the state of being extended by the tensile stress T, is carried out. In the second step of the present embodiment, as illustrated in FIG. 7(c), the second surface 42 side of the support substrate 40, where the electronic component 51 and wiring 52 are provided, is bonded to the first surface 21 of the substrate 20 where the reinforcing member 30 is provided. At such time, the adhesive layer 60 may be provided between the substrate 20 and the support substrate 40.

Thereafter, a third step in which the tensile stress T is removed from the substrate 20 is carried out. Thus, as indicated by the arrows C in FIG. 7(d), the substrate 20 contracts and deformation also occurs in the support substrate 40 and the wiring 52 which are bonded to the substrate 20. The third elastic modulus of the support substrate 40 is greater than the first elastic modulus of the substrate 20. Hence, deformation of the support substrate 40 and the wiring 52 can be made to occur as the generation of the meandering shape section.

Furthermore, in the present embodiment, the first reinforcing part 31 is disposed on the first surface 21 of the substrate 20 so as to overlap the electronic component 51. Hence, the section of the substrate 20 which overlaps the electronic component 51 can be restrained from extending in the first step. Hence, the section of the substrate 20 which overlaps the electronic component 51 can be restrained from contracting in the third step. It is accordingly possible to restrain stress caused by deformation of the substrate 20 from acting on the electronic component 51 and to suppress deformation of the electronic component 51 and damage to the electronic component 51. In addition, damage to the electrical junction between the electronic component 51 and the wiring 52 can be suppressed. Thus, according to the present embodiment, by controlling the deformation occurring in the substrate 20 in accordance with position, it is possible to improve the ease of mounting the electronic component 51 and the reliability of the electronic component 51 and wiring 52.

Figure 20:
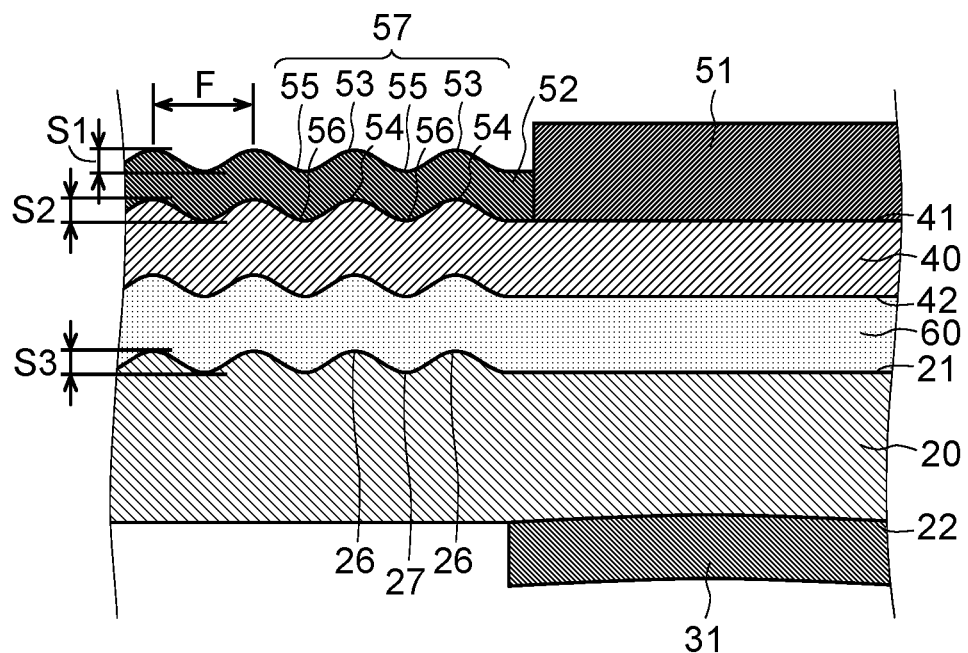
FIG. 20 is a cross-sectional view illustrating a wiring board according to a modification example.

Note that, when the substrate 20 extends, there is sometimes the possibility of deformation such as warping in the first reinforcing part 31, as illustrated in FIG. 20. Conversely, even when deformation occurs in the first reinforcing part 31, the amount of deformation of the first reinforcing part 31 is small in comparison with the amount of deformation that occurs in the section of the substrate 20 which does not overlap the first reinforcing part 31. It is therefore possible to restrain the electronic component 51 from deforming and being damaged. In addition, damage to the electrical junction between the electronic component 51 and the wiring 52 can be suppressed.

An example of results relating to the resistance value of the wiring 52 which are obtained due to the meandering shape section 57 of the wiring 52 will now be described. Here, the resistance value of the wiring 52 in a first state in which tensile stress along the planar direction of the first surface 21 of the substrate 20 is not being applied to the substrate 20 will be referred to as a first resistance value. Furthermore, the resistance value of the wiring 52 in a second state in which tensile stress is applied to the substrate 20 so as to extend the substrate 20 by 30% in comparison with the first state in the planar direction of the first surface 21 will be referred to as a second resistance value. According to the present embodiment, by forming the meandering shape section 57 in the wiring 52, the ratio of the absolute value of the difference between the first resistance value and second resistance value can be set at 20% or less, more preferably set at 10% or less, and still more preferably set at 5% or less, of the first resistance value.

Possible applications of the wiring board 10 include the healthcare field, the medical care field, the nursing field, the electronics field, the sports or fitness field, the beauty field, the mobility field, the animal or pets field, the amusement field, the fashion or apparel field, the security field, the military field, the distribution field, the education field, the building materials, furniture, decorating field, the environmental energy field, the forestry or fisheries field, and the robotics field, and so forth. For example, a product that is attached to a body part such as a person's arm is constituted by using the wiring board 10 according to the present embodiment. Because the wiring board 10 is capable of extending, by attaching the wiring board 10 to the body in an extended state, for example, the wiring board 10 may be placed in closer contact with a body part.

Hence, a favorable wearing sensation can be achieved. In addition, because it is possible to suppress a drop in the resistance value of the wiring 52 when the wiring board 10 is extended, favorable electrical characteristics for the wiring board 10 can be achieved. Additionally, because the wiring board 10 is capable of extending, the wiring board 10 is not limited to being fitted to a living body such as a person's body and can be installed and incorporated by fitting to a curved surface or a three-dimensional shape. Possible examples of such products include a vitals sensor, a mask, a hearing aid, a toothbrush, an adhesive plaster, a compress, a contact lens, a prosthetic arm, prosthetic leg, a glass eye, a catheter, a gauze, a medicine pack, a bandage, a disposable bioelectrode, a diaper, consumer electronics, sportswear, a wristband, a headband, a glove, a swimsuit, a jockstrap, a ball, a racket, an osmotic medicinal beauty mask, an electrostimulation diet product, a heating pack, automobile upholstery, a seat, an instrument panel, a stroller, a drone, a wheelchair, a tire, a collar, a lead, a haptic device, a luncheon mat, a hat, clothes, glasses, shoes, insoles, socks, stockings, innerwear, a muffler, earmuffs, a bag, an accessory, a ring, artificial nails, a watch, a personal ID recognition device, a helmet, a package, an IC tag, a PET bottle, stationery, a book, a carpet, a sofa, bedding, lighting, a door knob, a vase, a bed, a mattress, a cushion, a wireless power antenna, a battery, a plastic greenhouse, a robotic hand, and robotic armor.

Note that a variety of modifications may be applied to the foregoing embodiment. Modification examples will be described hereinbelow with reference to the drawings where necessary. In the description hereinbelow and the drawings used in the description hereinbelow, it is assumed that the same reference signs as the reference signs used for corresponding parts in the foregoing embodiment are used for those parts that may be configured in the same way as the foregoing embodiment, and repetitious descriptions are omitted. Furthermore, in cases where it is obvious that the action and effect obtained in the foregoing embodiment is also obtained in the modification example, a description thereof is also omitted.

First Modification Example

Figure 8:
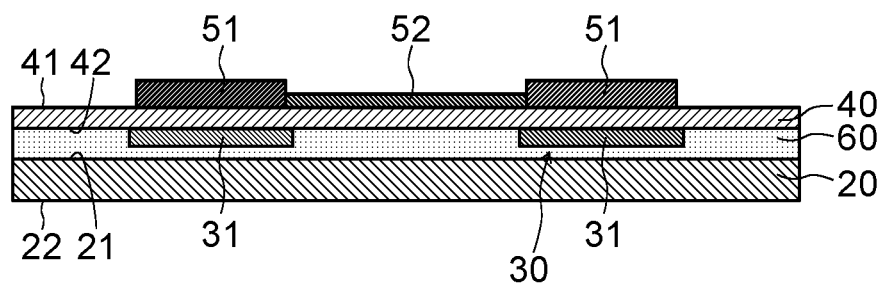
FIG. 8 is a cross-sectional view illustrating a wiring board according to a first modification example.

Although the example in which the reinforcing member 30 is positioned on the second surface 22 side of the substrate 20 is illustrated in the foregoing embodiment, the present disclosure is not limited to or by this example. The reinforcing member 30 may be provided on the first surface 21 side of the substrate 20. For example, as illustrated in FIG. 8, the first reinforcing part 31 of the reinforcing member 30 may be positioned between the first surface 21 of the substrate 20 and the electronic component 51. In the example illustrated in FIG. 8, the first reinforcing part 31 is positioned on the second surface 42 of the support substrate 40. Although not illustrated, the second reinforcing part 32 of the reinforcing member 30 may also be provided on the second surface 42 of the support substrate 40.

Figure 9:
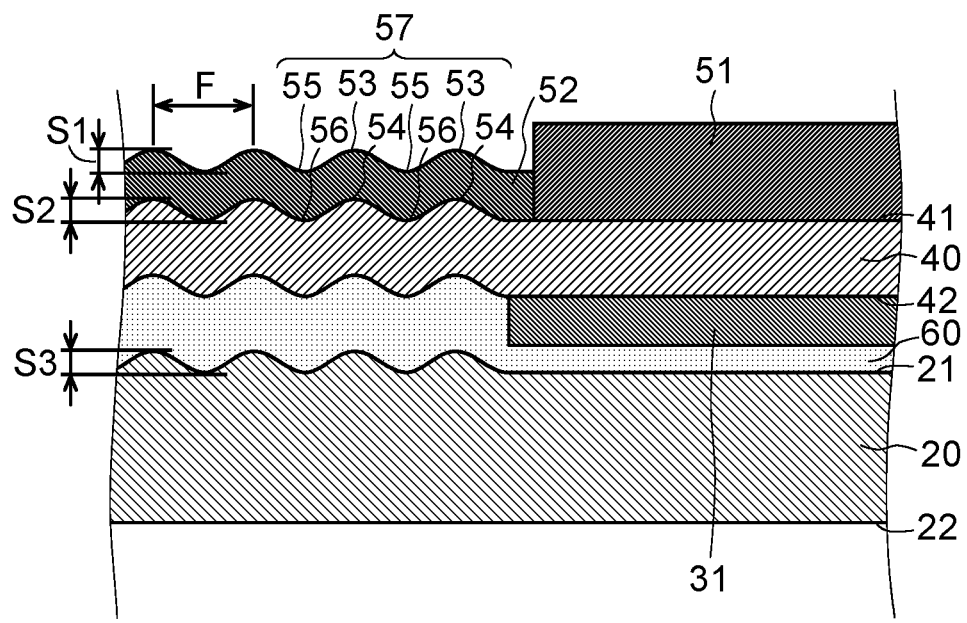
FIG. 9 is a cross-sectional view illustrating an enlargement of an example of wiring of the wiring board illustrated in FIG. 8, and peripheral constituent elements thereof.

FIG. 9 is a cross-sectional view illustrating an enlargement of an example of the wiring 52 of the wiring board 10 illustrated in FIG. 8, and peripheral constituent elements thereof. Also in this modification example, as per the foregoing embodiment, the meandering shape section 57 is formed in the section of the wiring 52 which does not overlap the reinforcing member 30. Therefore, an increase in the overall length of the wiring 52 as well as a reduction in the cross-sectional surface area of the wiring 52 as the substrate 20 deforms can be suppressed.

FIGS. 10(a) to 10(d) are diagrams to illustrate a method for manufacturing the wiring board 10 illustrated in FIG. 8.

Figure 10A:
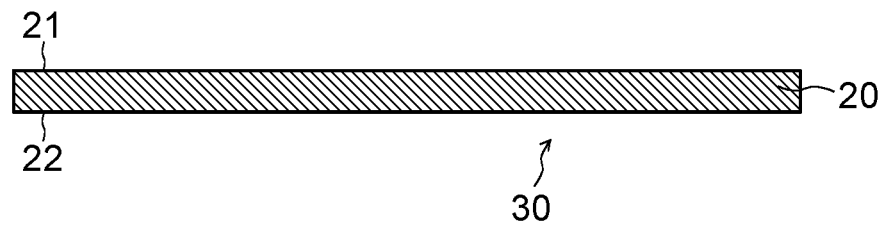
FIG. 10 is a diagram to illustrate a method for manufacturing the wiring board illustrated in FIG. 8.
Figure 10B:
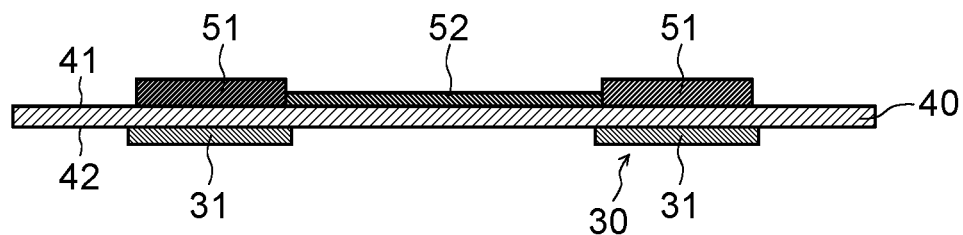

First, as illustrated in FIG. 10(a), a substrate preparation step in which the substrate 20 is prepared is carried out. Then, as illustrated in FIG. 10(b), a support substrate preparation step in which the support substrate 40 is prepared is carried out. In this modification example, in the support substrate preparation process, the electronic component 51 and wiring 52 are provided on the first surface 41 of the support substrate 40, as illustrated in FIG. 10(b). Furthermore, the reinforcing member 30, which includes the first reinforcing part 31 and the like, is provided on the second surface 42 of the support substrate 40. The order in which the reinforcing member 30, electronic component 51, and wiring 52 are provided on the support substrate 40 is optional.

Figure 10C:
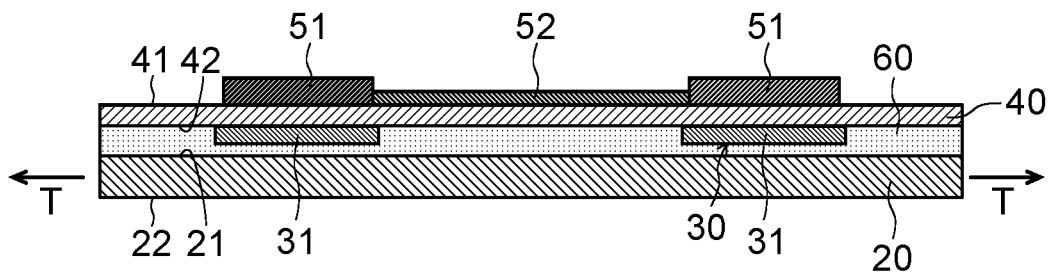
Figure 10D:
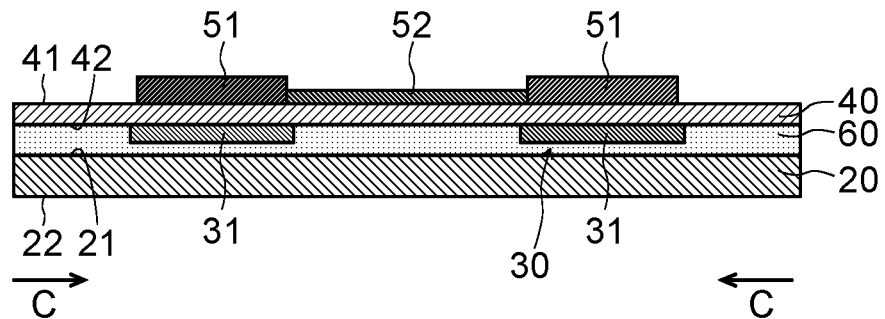

Next, a first step of extending the substrate 20 by applying a tensile stress T to the substrate 20 is implemented. Thereafter, a second step of providing the electronic component 51 and wiring 52 on the first surface 21 side of the substrate 20, which is in the state of being extended by the tensile stress T, is carried out. In this modification example, in the second step, the second surface 42 side of the support substrate 40, where the reinforcing member 30, electronic component 51, and wiring 52 are provided, is bonded to the first surface 21 of the substrate 20, as illustrated in FIG. 10(c).

Thereafter, a third step in which the tensile stress T is removed from the substrate 20 is carried out. Thus, as indicated by the arrows C in FIG. 10(d), the substrate 20 contracts and deformation also occurs in the support substrate 40 and the wiring 52 which are bonded to the substrate 20. The third elastic modulus of the support substrate 40 is greater than the first elastic modulus of the substrate 20. Hence, deformation of the support substrate 40 and the wiring 52 can be made to occur as the generation of the meandering shape section.

Further, in this modification example, the first reinforcing part 31 is disposed on the second surface 42 of the support substrate 40 so as to overlap the electronic component 51. Hence, it is possible to restrain the electronic component 51 from being subjected to the effect of the substrate 20 contracting in the third step. It is thus possible to restrain the electronic component 51 from deforming and being damaged.

Second Modification Example

Figure 11:
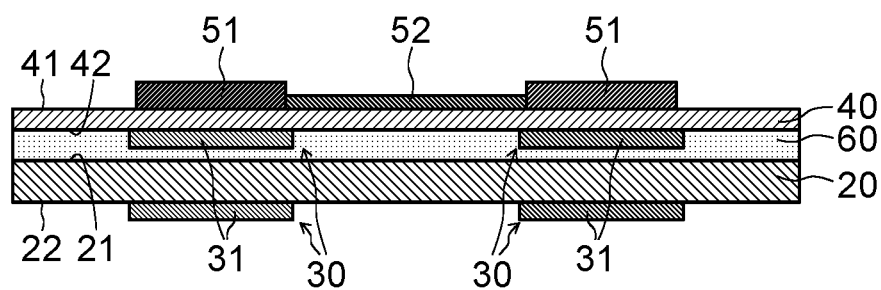
FIG. 11 is a cross-sectional view illustrating a wiring board according to a second modification example.

Although the example in which the reinforcing member 30 is positioned on either the second surface 22 of the substrate 20 or the second surface 42 of the support substrate 40 is illustrated in the foregoing embodiment and first modification example, the present disclosure is not limited to or by this example. As illustrated in FIG. 11, the first reinforcing part 31 of the reinforcing member 30 may be positioned either on the second surface 22 side of the substrate 20, or between the first surface 21 of the substrate 20 and the electronic component 51. In the example illustrated in FIG. 11, the wiring board 10 includes a first reinforcing part 31 positioned on the second surface 22 of the substrate 20 and a first reinforcing part 31 positioned on the second surface 42 of the support substrate 40. Although not illustrated, the second reinforcing part 32 of the reinforcing member 30 may also be provided on the second surface 22 of the substrate 20 and on the second surface 42 of the support substrate 40.

Figure 12:
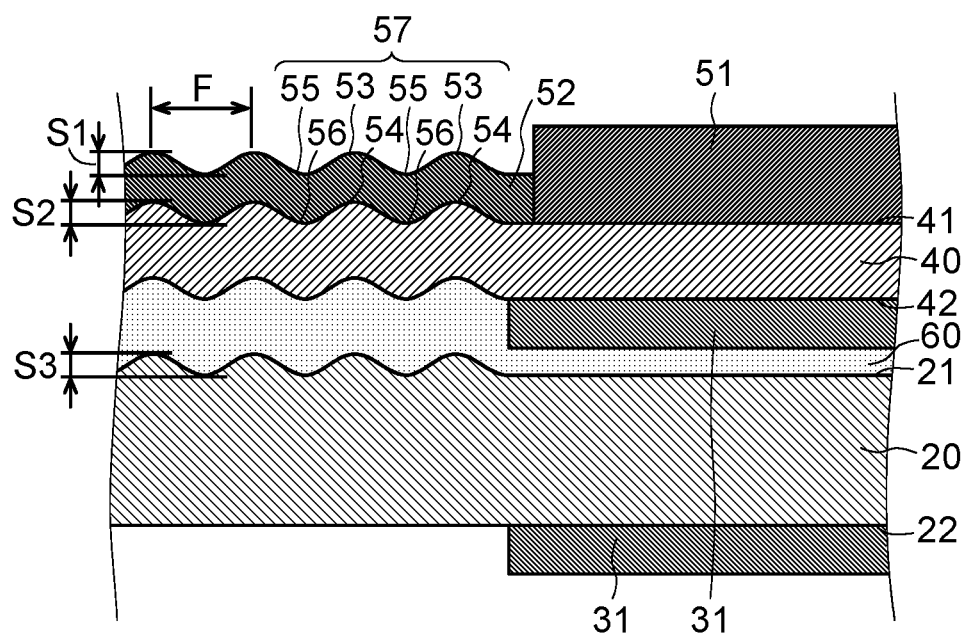
FIG. 12 is a cross-sectional view illustrating an enlargement of an example of wiring of the wiring board illustrated in FIG. 11, and peripheral constituent elements thereof.

FIG. 12 is a cross-sectional view illustrating an enlargement of an example of the wiring 52 of the wiring board 10 illustrated in FIG. 11, and peripheral constituent elements thereof. Also in this modification example, as per the foregoing embodiment, the meandering shape section 57 is formed in the section of the wiring 52 which does not overlap the reinforcing member 30. Therefore, an increase in the overall length of the wiring 52 as well as a reduction in the cross-sectional surface area of the wiring 52 as the substrate 20 deforms can be suppressed.

FIGS. 13(a) to 13(d) are diagrams to illustrate a method for manufacturing the wiring board 10 illustrated in FIG. 11.

Figure 13A:
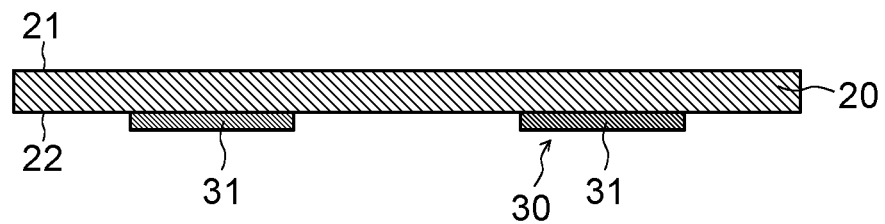
FIG. 13 is a diagram to illustrate a method for manufacturing the wiring board illustrated in FIG. 11.
Figure 13B:
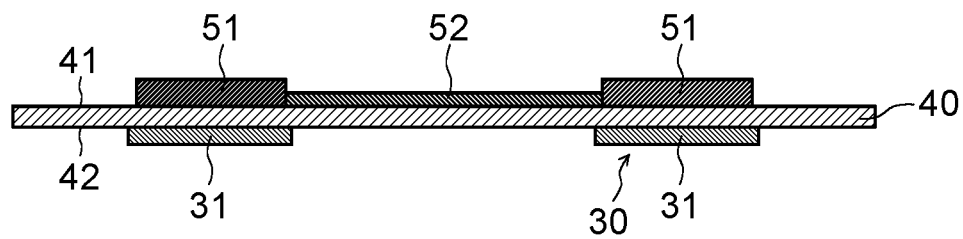

First, as illustrated in FIG. 13(a), a substrate preparation step in which the substrate 20 is prepared is carried out. In this modification example, in the substrate preparation process, the first reinforcing part 31 is provided on the second surface 22 of the substrate 20, as illustrated in FIG. 13(a). Then, as illustrated in FIG. 13(b), a support substrate preparation step in which the support substrate 40 is prepared is carried out. In this modification example, in the support substrate preparation process, the electronic component 51 and wiring 52 are provided on the first surface 41 of the support substrate 40, as illustrated in FIG. 13(b). Furthermore, the reinforcing member 30, which includes the first reinforcing part 31 and the like, is provided on the second surface 42 of the support substrate 40. The order in which the reinforcing member 30, electronic component 51, and wiring 52 are provided on the support substrate 40 is optional.

Figure 13C:
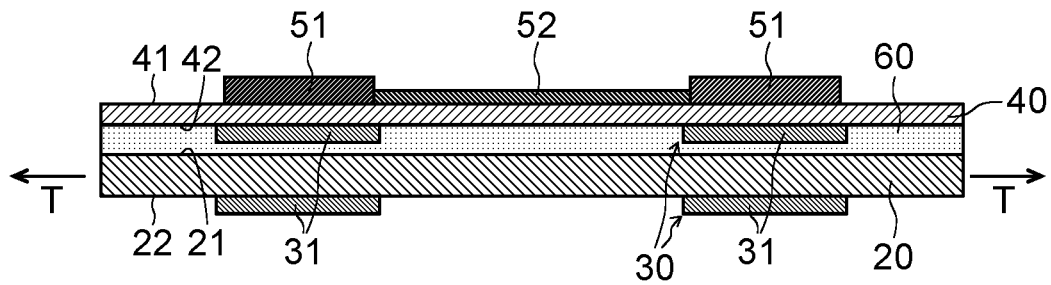
Figure 13D:
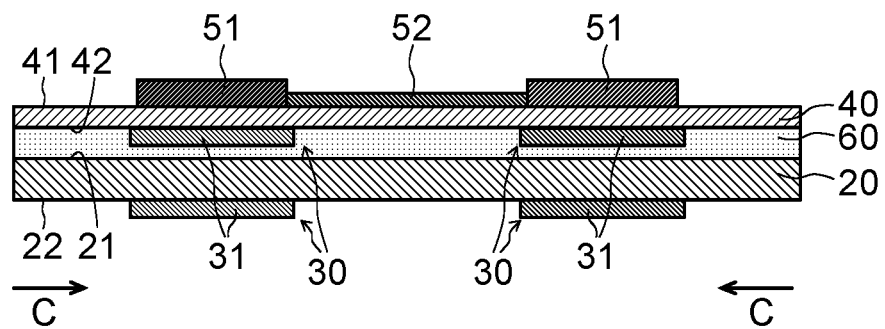

Next, a first step of extending the substrate 20 by applying a tensile stress T to the substrate 20 is implemented. Thereafter, a second step of providing the electronic component 51 and wiring 52 on the first surface 21 side of the substrate 20, which is in the state of being extended by the tensile stress T, is carried out. In the second step of this modification example, as illustrated in FIG. 13(c), the second surface 42 side of the support substrate 40, where the reinforcing member 30, electronic component 51, and wiring 52 are provided, is bonded to the first surface 21 of the substrate 20 where the reinforcing member 30 is provided.

Thereafter, a third step in which the tensile stress T is removed from the substrate 20 is carried out. Thus, as indicated by the arrows C in FIG. 13(d), the substrate 20 contracts and deformation also occurs in the support substrate 40 and the wiring 52 which are bonded to the substrate 20. The third elastic modulus of the support substrate 40 is greater than the first elastic modulus of the substrate 20. Hence, deformation of the support substrate 40 and the wiring 52 can be made to occur as the generation of the meandering shape section.

Further, in this modification example, the first reinforcing part 31 is disposed on both the second surface 22 of the substrate 20 and the second surface 42 of the support substrate 40 so as to overlap the electronic component 51. Hence, the section of the substrate 20 which overlaps the electronic component 51 can be further restrained from extending in the first step. Hence, the section of the substrate 20 which overlaps the electronic component 51 can be restrained from contracting in the third step. It is accordingly possible to restrain stress caused by deformation of the substrate 20 from acting on the electronic component 51 and to suppress deformation of and damage to the electronic component 51. In addition, damage to the electrical junction between the electronic component 51 and the wiring 52 can be suppressed.

Third Modification Example

Figure 14:
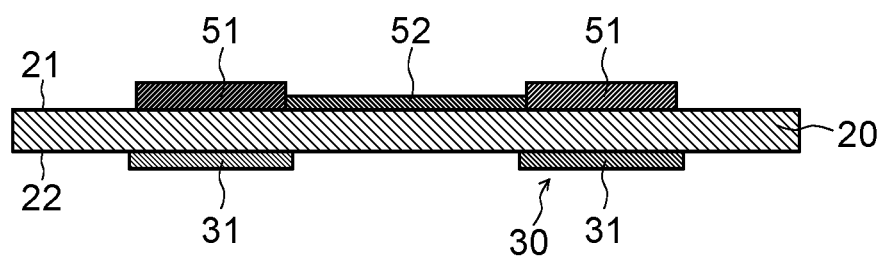
FIG. 14 is a cross-sectional view illustrating a wiring board according to a third modification example.

In the foregoing embodiment and modification examples, the example in which the electronic component 51 and wiring 52 are supported by the support substrate 40, which has a third elastic modulus greater than the first elastic modulus of the substrate 20 is illustrated, but the present disclosure is not limited to or by this example. As illustrated in FIG. 14, the electronic component 51 and the wiring 52 may also be provided on the first surface 21 of the substrate 20. In this case, the reinforcing member 30 including at least the first reinforcing part 31 is positioned on the second surface 22 side of the substrate 20.

Figure 15:
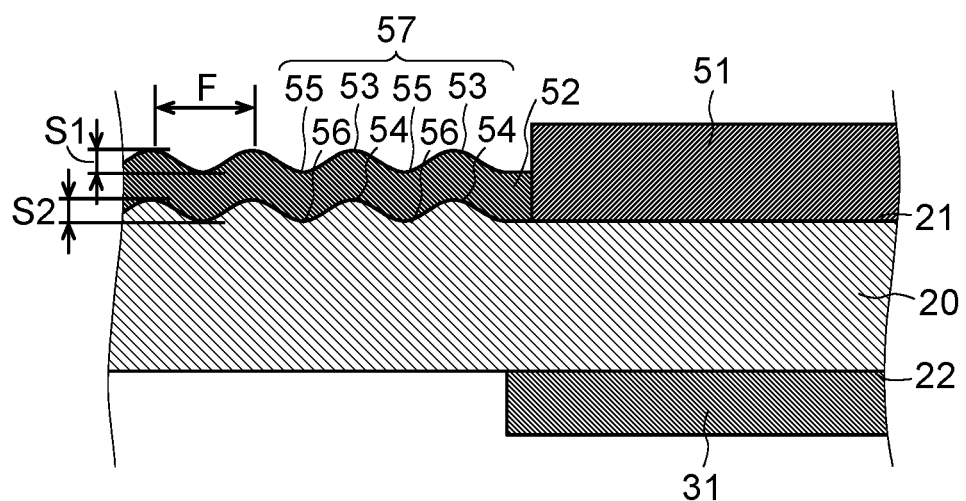
FIG. 15 is a cross-sectional view illustrating an enlargement of an example of wiring of the wiring board illustrated in FIG. 14, and peripheral constituent elements thereof.

FIG. 15 is a cross-sectional view illustrating an enlargement of an example of the wiring 52 of the wiring board 10 illustrated in FIG. 14, and peripheral constituent elements thereof. Also in this modification example, as per the foregoing embodiment, the meandering shape section 57 is formed in the section of the wiring 52 which does not overlap the reinforcing member 30. Therefore, an increase in the overall length of the wiring 52 as well as a reduction in the cross-sectional surface area of the wiring 52 as the substrate 20 deforms can be suppressed.

FIGS. 16(a) to 16(d) are diagrams to illustrate a method for manufacturing the wiring board 10 illustrated in FIG. 14.

Figure 16A:
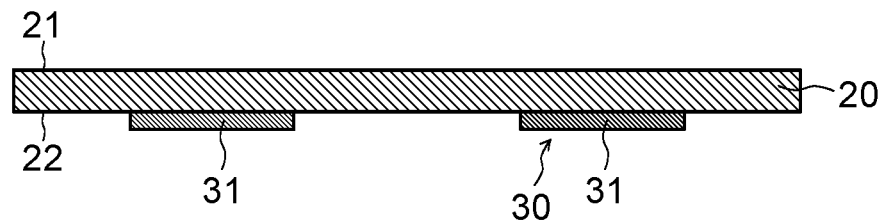
FIG. 16 is a diagram to illustrate a method for manufacturing the wiring board illustrated in FIG. 14.

First, as illustrated in FIG. 16(a), a substrate preparation step in which a substrate 20 is prepared is carried out. In this modification example, in the substrate preparation process, the first reinforcing part 31 is provided on the second surface 22 of the substrate 20, as illustrated in FIG. 16(a).

Figure 16B:
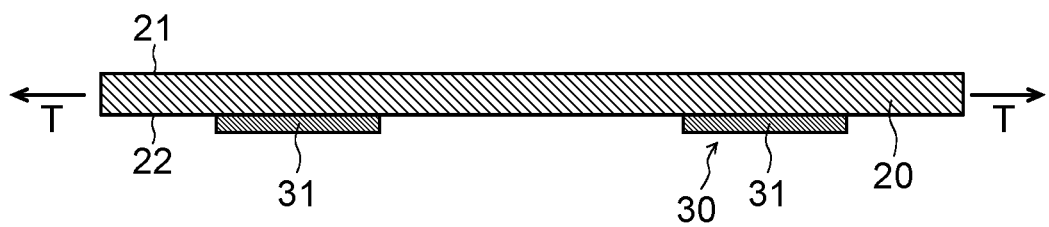
Figure 16C:
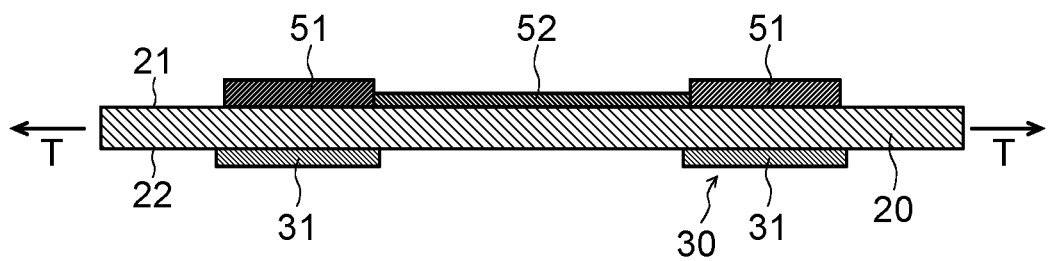
Figure 16D:
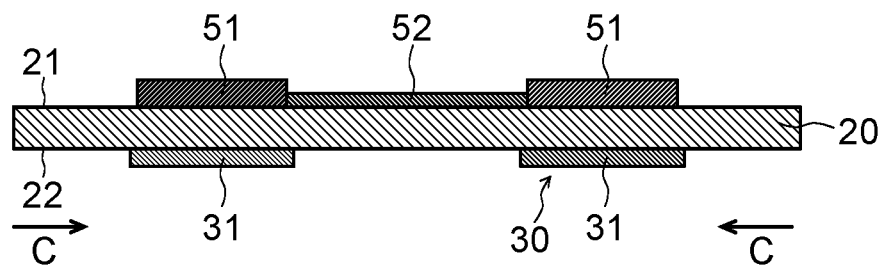

Next, as illustrated in FIG. 16(b), a first step of extending the substrate 20 by applying a tensile stress T to the substrate 20 is implemented. Thereafter, as illustrated in FIG. 16(c), a second step of providing an electronic component 51 and wiring 52 to a first surface 21 of the substrate 20, which is in the state of being extended by the tensile stress T, is carried out.

Thereafter, a third step in which the tensile stress T is removed from the substrate 20 is carried out. Thus, as indicated by the arrows C in FIG. 16(*d*), the substrate 20 contracts and deformation also occurs in the wiring 52 provided to the substrate 20. The reinforcing member 30 is disposed so as not to overlap the whole of the wiring 52 or the majority of the wiring 52. Hence, deformation of the wiring 52 occurs as the generation of the meandering shape section.

Furthermore, in this modification example, the first reinforcing part 31 is disposed on the second surface 22 of the substrate 20. Hence, the planned section of the substrate 20 which overlaps the electronic component 51 can be restrained from extending in the first step. Hence, the section of the substrate 20 which overlaps the electronic component 51 can be restrained from contracting in the third step. It is accordingly possible to restrain stress caused by deformation of the substrate 20 from acting on the electronic component 51 and to suppress deformation of and damage to the electronic component 51.

Fourth Modification Example

Figure 17:
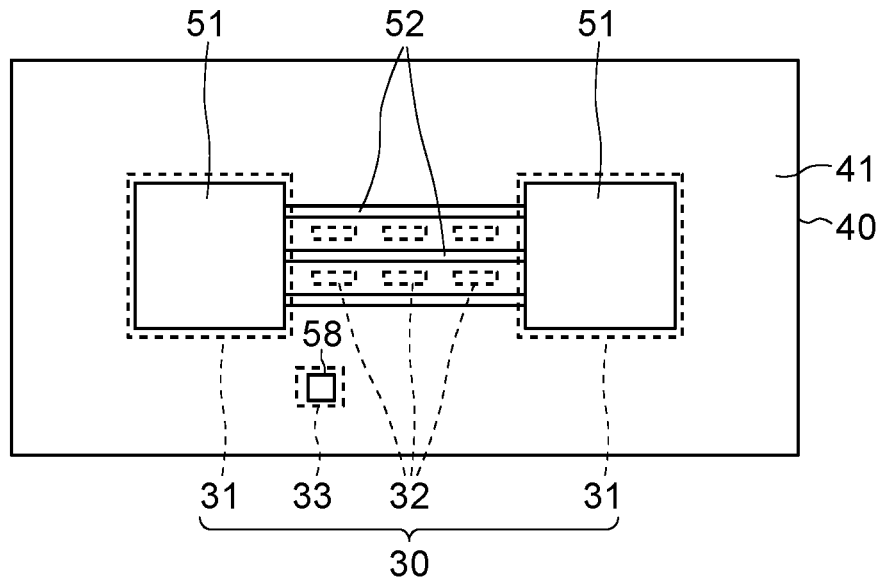
FIG. 17 is a plan view illustrating a wiring board according to a fourth modification example.

In this modification example, the example in which the reinforcing member 30 includes a third reinforcing part 33 will be described. FIG. 17 is a plan view illustrating a wiring board 10 according to this modification example. As illustrated in FIG. 17, the third reinforcing part 33 at least partially overlaps an electrode pad 58 when viewed along the normal direction of the first surface 21 of the substrate 20. The electrode pad 58 is provided on the support substrate 40 positioned on the first surface 21 side of the substrate 20. In the example illustrated in FIG. 17, the third reinforcing part 33 has a contour that surrounds the electrode pad 58.

The electrode pad 58 is a member for electrically connecting an external apparatus or device to the electronic component 51 or wiring 52 of the wiring board 10. The electrode pad 58 is electrically connected to the electronic component 51 or the wiring 52. Furthermore, the electrode pad 58 is made of a member having the same conductivity as the wiring 52. A testing probe or the like, a connector or terminal for rewriting the firmware of the electronic component 51, or the like, or a connector or a terminal for electrically connecting an external device to the wiring board 10, or the like, is connected to the electrode pad 58.

According to this modification example, by providing the third reinforcing part 33 on the wiring board 10 so as to overlap the electrode pad 58, stress caused by deformation of the substrate 20 can be restrained from acting on the electrode pad 58. Thus, damage to the electrical junction between the electrode pad 58 and the wiring 52, and the like, can be suppressed.

Fifth Modification Example

Figure 21:
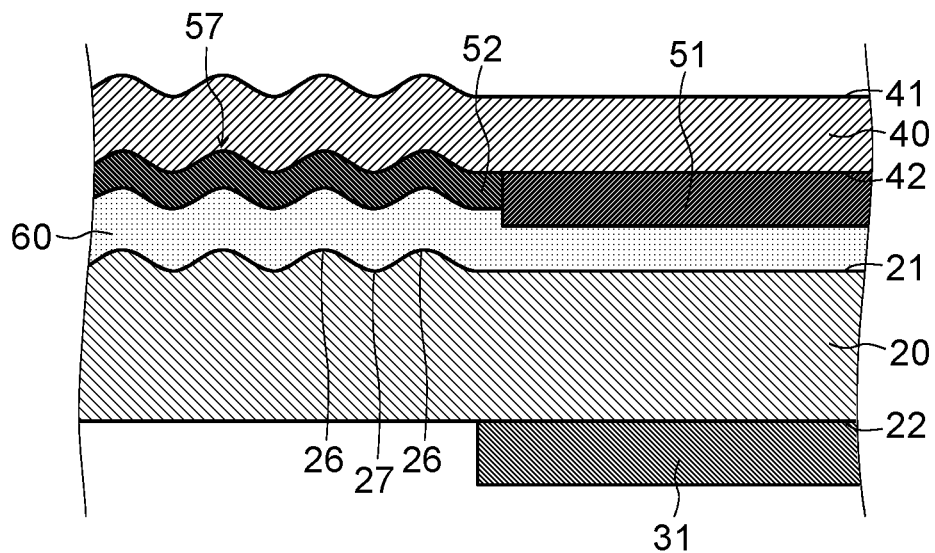
FIG. 21 is a cross-sectional view illustrating a wiring board according to a fifth modification example.
Figure 22:
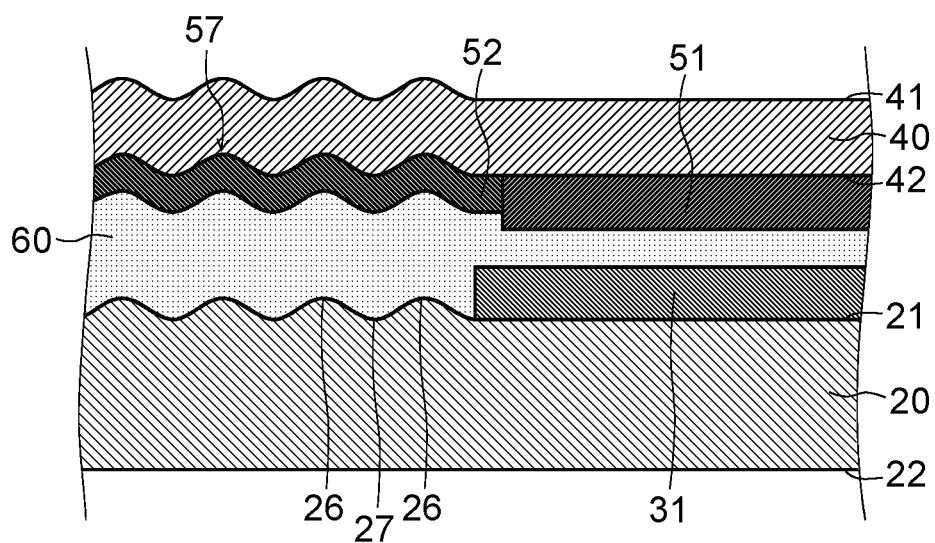
FIG. 22 is a cross-sectional view illustrating the wiring board according to the fifth modification example.
Figure 23:
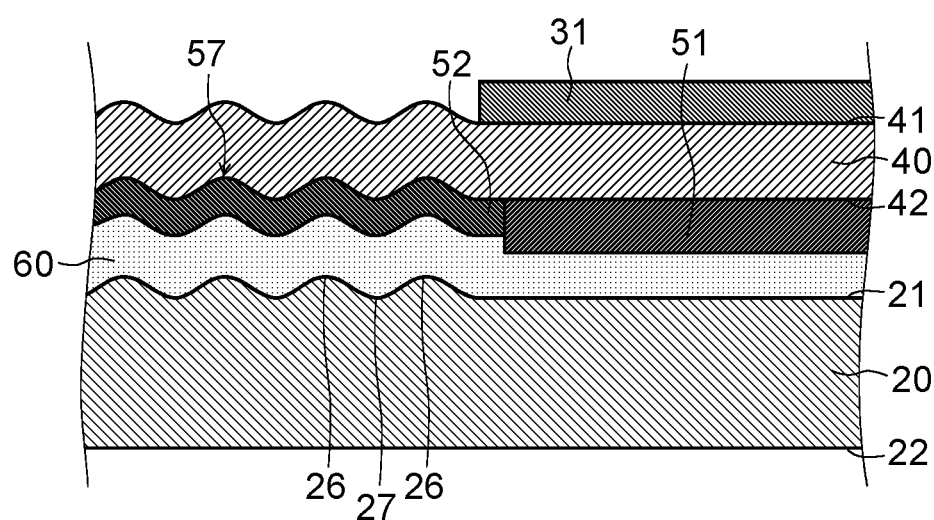
FIG. 23 is a cross-sectional view illustrating the wiring board according to the fifth modification example.

In the foregoing embodiment and modification examples, the example in which the electronic component 51 and the wiring 52 are positioned on the first surface 41 of the support substrate 40, is illustrated. However, the present disclosure is not limited to or by this example. As illustrated in FIG. 21, 22, or 23, the electronic component 51 and the wiring 52 may also be positioned on the second surface 42 of the support substrate 40. In this case, the first reinforcing part 31 may be positioned on the second surface 22 of the substrate 20 as illustrated in FIG. 21. The first reinforcing part 31 may be positioned on the first surface 21 of the substrate 20 as illustrated in FIG. 22. The first reinforcing part 31 may be positioned on the first surface 41 of the support substrate as illustrated in FIG. 23.

Sixth Modification Example

Figure 24:
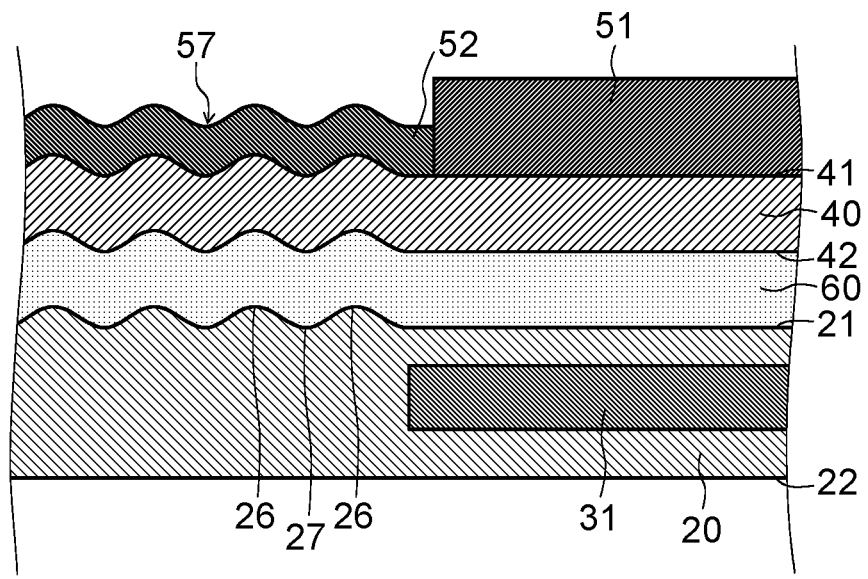
FIG. 24 is a cross-sectional view illustrating a wiring board according to a sixth modification example.
Figure 25:
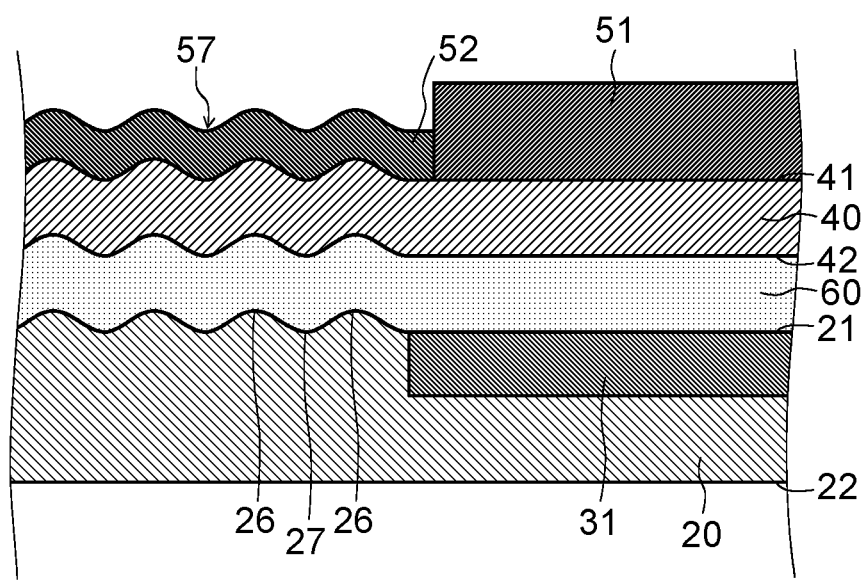
FIG. 25 is a cross-sectional view illustrating the wiring board according to the sixth modification example.
Figure 26:
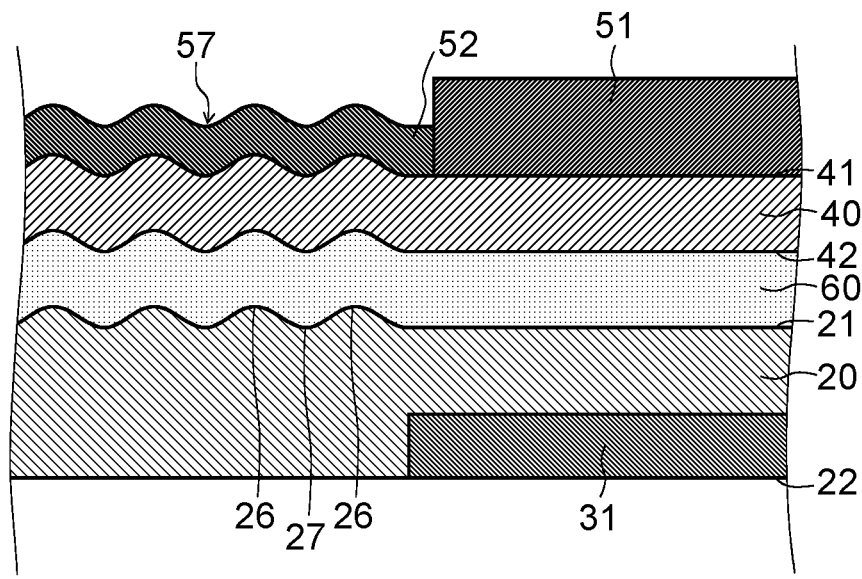
FIG. 26 is a cross-sectional view illustrating the wiring board according to the sixth modification example.
Figure 27:
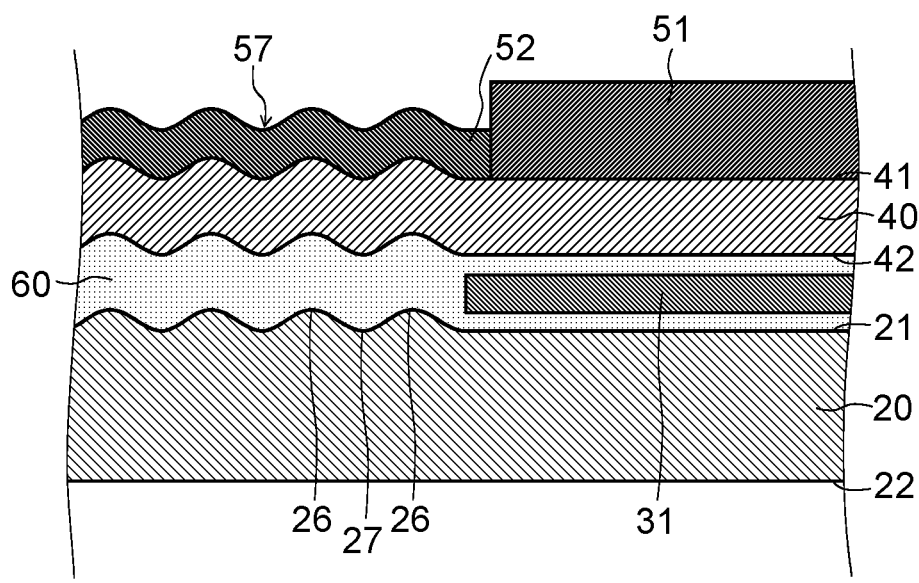
FIG. 27 is a cross-sectional view illustrating the wiring board according to the sixth modification example.

In the foregoing embodiment and modification examples, the example in which the first reinforcing part 31 is positioned on the surface of the substrate 20 or on the surface of the support substrate 40 is illustrated. However, the present disclosure is not limited to or by this example. The first reinforcing part 31 may be embedded in the substrate 20 or the adhesive layer 60. For example, as illustrated in FIG. 24, the first reinforcing part 31 may be embedded in the substrate 20 so as not to be exposed to the first surface 21 or the second surface 22 of the substrate 20. As illustrated in FIG. 25, the first reinforcing part 31 may be embedded in the substrate 20 so as not to be exposed to the first surface 21 of the substrate 20. As illustrated in FIG. 26, the first reinforcing part 31 may be embedded in the substrate 20 so as not to be exposed to the second surface 22 of the substrate 20. As illustrated in FIG. 27, the first reinforcing part 31 may be embedded in the adhesive layer 60.

Seventh Modification Example

Figure 28:
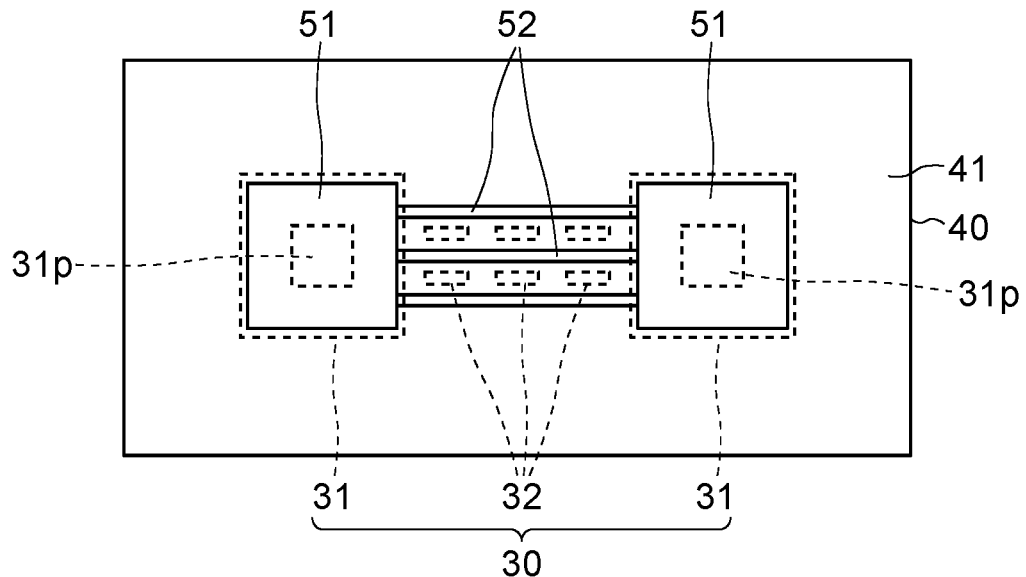
FIG. 28 is a plan view illustrating a wiring board according to a seventh modification example.

In the foregoing embodiment and modification examples, the example in which the first reinforcing part 31 overlaps the electronic component 51 across the whole area of the electronic component 51 when viewed along the normal direction of the first surface 21 of the substrate 20, is illustrated. However, the present disclosure is not limited to or by this example. The outer perimeter of the first reinforcing part 31 may be positioned at least partially further outside than the outer perimeter of the electronic component 51. For example, as illustrated in FIG. 28, an opening 31*p* that passes through the first reinforcing part 31 may be formed in a position of the first reinforcing part 31 further inside than the outer perimeter of the electronic component 51. Also in the example illustrated in FIG. 28, the outer perimeter of the first reinforcing part 31 extends further outside than the outer perimeter of the electronic component 51. Hence, it is possible to restrain stress caused by deformation of the substrate 20 from acting on the electronic component 51 and to suppress deformation of and damage to the electronic component 51. In addition, damage to the electrical junction between the electronic component 51 and the wiring 52 can be suppressed.

Eighth Modification Example

Figure 29A:
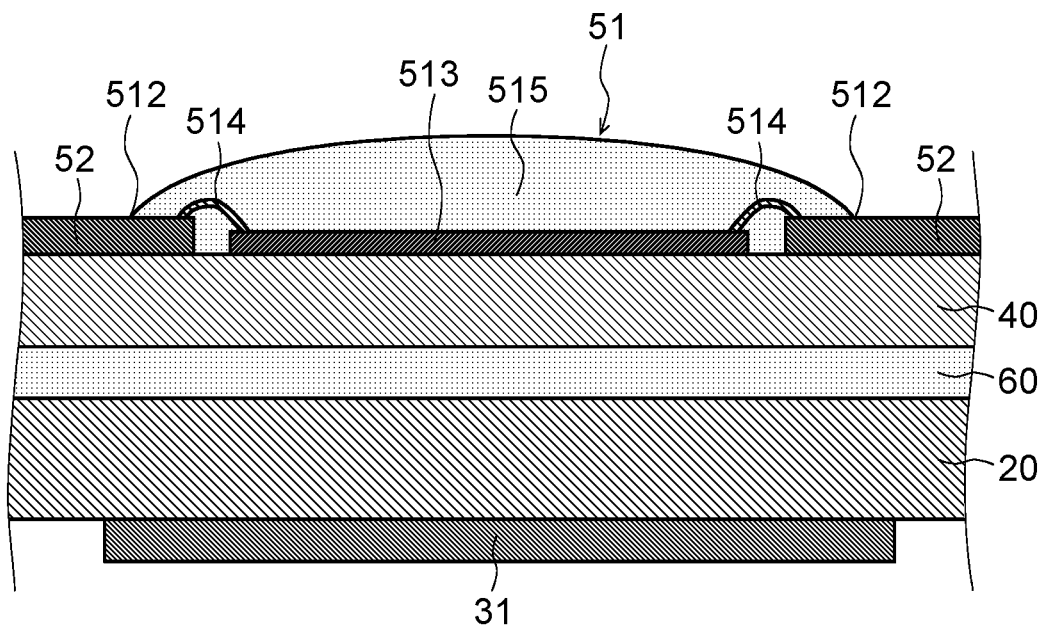
FIG. 29A is a cross-sectional view illustrating a wiring board according to an eighth modification example.

In the foregoing embodiment and modification examples, the example in which the electronic component 51 is pre-packaged at a stage before being mounted on the wiring board 10 is illustrated. Nevertheless, the present disclosure is not limited to or by this example. The electronic component 51 may also be configured by mounting some of the constituent elements of the electronic component 51 on the wiring board 10 and then sealing a portion of the constituent elements. For example, as illustrated in FIG. 29A, the electronic component 51 may include a chip 513, a wire 514 that connects the chip 513 to the wiring 52, and a resin 515 that covers the chip 513 and the wire 514. The wire 514 functions as an electrode that is connected to the wiring 52. In the production process to provide this electronic component 51, the chip 513 is first placed on the support substrate 40, for example, of the wiring board 10. In so doing, the chip 513 may be fixed to the wiring board 10 by using an adhesive or the like. The wire 514 is then connected to the chip 513 and the wiring 52. The wire 514 contains gold, aluminum or copper, or the like. Thereafter, liquid resin is dripped onto the chip 513 and the wire 514 to form the resin 515 that covers the chip 513 and wire 514. This process is also referred to as potting. A urethane resin or an epoxide resin, or the like, may also be employed as the resin 515. In cases where the electronic component 51 contains the resin 515 as illustrated in FIG. 29A, the end portion of the resin 515 is then an outer perimeter 512 of the electronic component 51.

The section of the substrate 20 which overlaps the resin 515 does not readily deform in comparison with the section of the substrate 20 which does not overlap the resin 515. In this case, when extension or contraction occur in the substrate 20, there is a concentration of stress in the border section between the section of the wiring board 10 which overlaps the resin 515 and the section of the wiring board 10 which does not overlap the resin 515. In view of the concentration of stress, as illustrated in FIG. 29A, the first reinforcing part 31 is provided so as to expand further outside than the outer perimeter 512 of the electronic component 51. It is accordingly possible to restrain stress caused by deformation of the substrate 20 from acting on the electronic component 51 and to suppress deformation of and damage to the electronic component 51. In addition, damage to the electrical junction between the electronic component 51 and the wiring 52 can be suppressed.

Figure 29B:
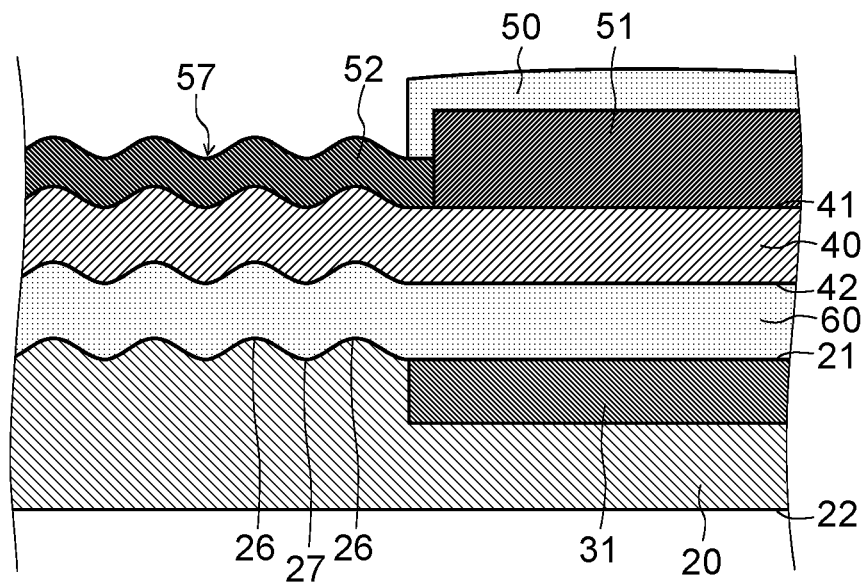
FIG. 29B is a cross-sectional view illustrating another example of the wiring board according to the eighth modification example.
Figure 29C:
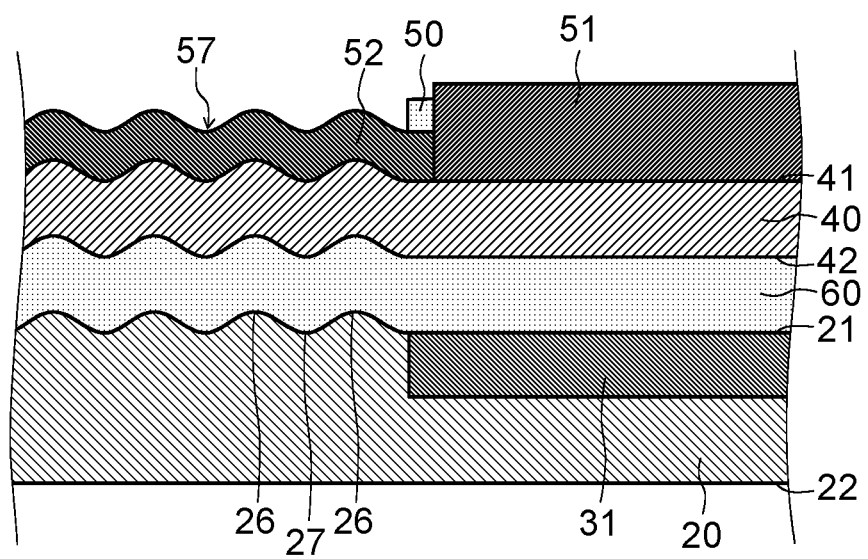
FIG. 29C is a cross-sectional view illustrating another example of the wiring board according to the eighth modification example.

Although the example in which the potting resin 515 covers the whole of the chip 513 is illustrated in FIG. 29A, the present disclosure is not limited to or by this example. As illustrated in FIGS. 29B and 29C, in order to reinforce the packaged electronic component 51, a resin 50 for potting may be provided. In this case, as illustrated in FIG. 29B, the resin 50 may cover the whole of the electronic component 51. Alternatively, as illustrated in FIG. 29C, the resin 50 need not cover the whole of the electronic component 51. For example, the resin 50 may be positioned between the end portion of the first reinforcing part 31 and the end portion of the electronic component 51 in the periphery of the electronic component 51 so as to reinforce the periphery of the electronic component 51. Also in either of the examples of FIGS. 29B and 29C, the resin 50 is preferably positioned further on the inside than the end portion of the first reinforcing part 31 (on the electronic component 51 side).

Ninth Modification Example

In the foregoing embodiment and modification examples, the example in which the electronic component 51 is a component comprising a member different from the constituent elements of the wiring board 10 is illustrated. In the modification examples hereinbelow, an example in which the electronic component 51 includes a member that is integral to at least one constituent element among the plurality of constituent elements of the wiring board 10 will be described.

Figure 30:
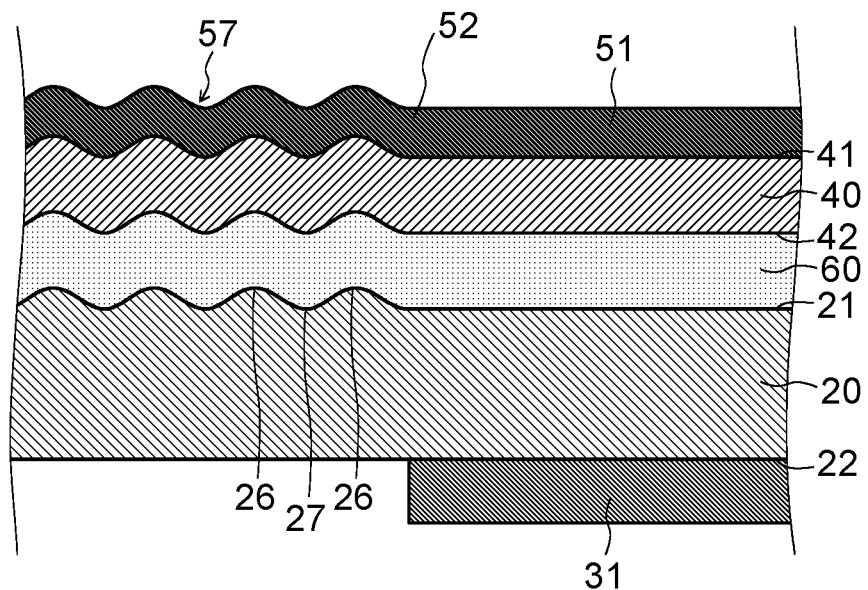
FIG. 30 is a cross-sectional view illustrating an electronic component according to a ninth modification example.

FIG. 30 is a cross-sectional view illustrating an enlargement of a wiring board 10 according to a modification example. As illustrated in FIG. 30, the electronic component 51 includes a conductive layer which is integral to the conductive layer constituting the wiring 52 of the wiring board 10. In the example illustrated in FIG. 30, the conductive layer constituting the wiring 52 and the conductive layer constituting the electronic component 51 are both positioned on the first surface 41 of the support substrate 40. The meandering shape section 57 appears in the conductive layer constituting the wiring 52. However, the first reinforcing part 31 overlaps the conductive layer constituting the electronic component 51 and hence a meandering shape section does not appear in the conductive layer constituting the electronic component 51.

Figure 31:
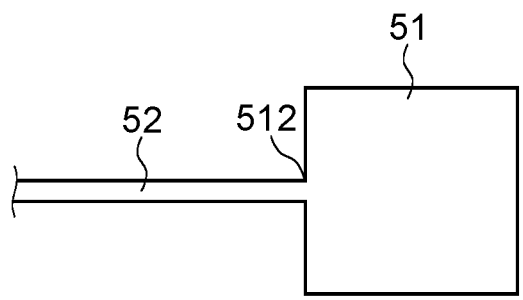
FIG. 31 is a plan view illustrating an example of the electronic component according to the ninth modification example.

FIG. 31 is a plan view illustrating an example of the electronic component 51 illustrated in FIG. 30. In the example illustrated in FIG. 31, the conductive layer constituting the electronic component 51 has a wider width than the conductive layer constituting the wiring 52. The section in which the width of the conductive layer changes is the outer perimeter 512 of the electronic component 51. The electronic component 51 illustrated in FIG. 31 is capable of functioning as a pad, for example. A testing probe or a terminal for software rewrites, or the like, is connected to the pad.

Figure 32:
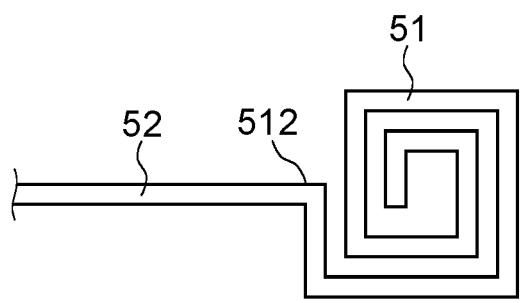
FIG. 32 is a plan view illustrating an example of the electronic component according to the ninth modification example.

FIG. 32 is a plan view illustrating another example of the electronic component 51 illustrated in FIG. 30. In the example illustrated in FIG. 32, the conductive layer constituting the electronic component 51 has a shape that extends in a helical shape. The section of the conductive layer that starts to extend in a helical shape is the outer perimeter 512 of the electronic component 51. The electronic component 51 that includes a conductive layer having a predetermined pattern as illustrated in FIG. 32 is capable of functioning as an antenna or a pressure sensor.

Figure 33A:
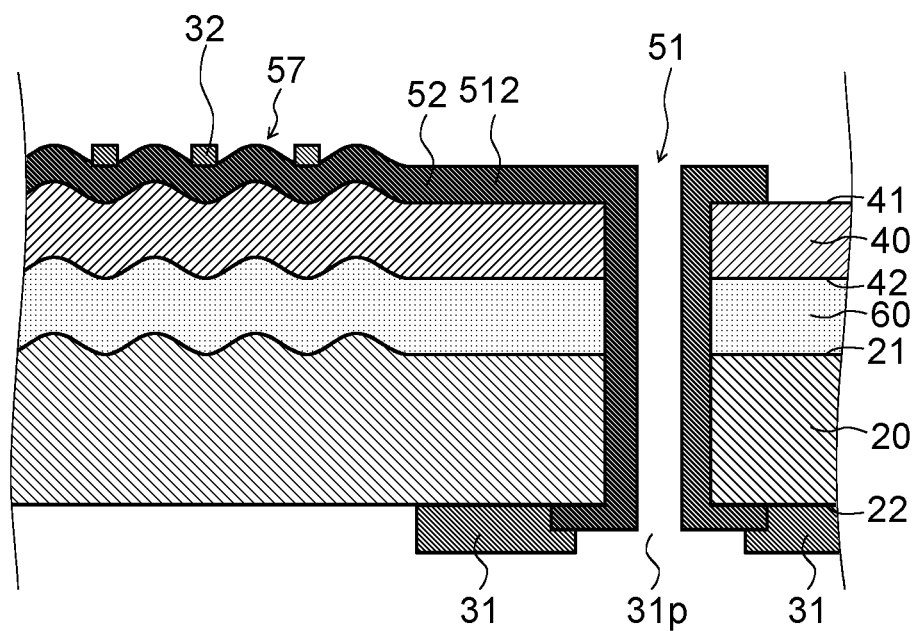
FIG. 33A is a cross-sectional view illustrating an example of the electronic component according to the ninth modification example.
Figure 33B:
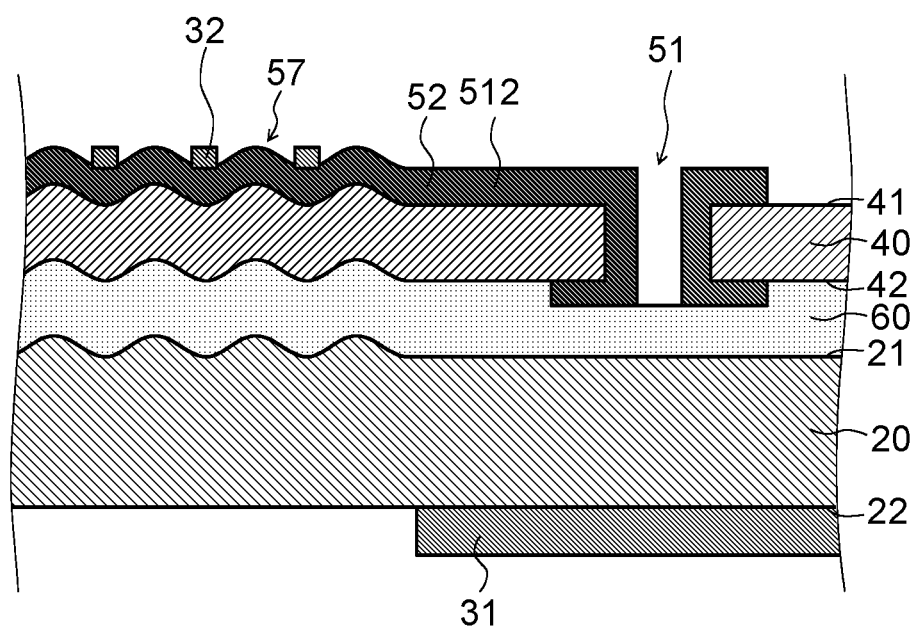
FIG. 33B is a cross-sectional view illustrating another example of the electronic component according to the ninth modification example.

FIGS. 33A and 33B are cross-sectional views illustrating an enlargement of a wiring board 10 according to a modification example. As illustrated in FIG. 33, the electronic component 51 includes a through-hole provided in the wiring board 10 and a conductive layer provided on the wall surface of the through-hole. The through-hole may pass through the whole of the wiring board 10 as illustrated in FIG. 33A or may pass through part of the wiring board 10 as illustrated in FIG. 33B. In the example illustrated in FIG. 33B, the through-hole passes through the support substrate 40 but does not pass through the substrate 20. The conductive layer of the electronic component 51 is configured integral to the conductive layer constituting the wiring 52.

As illustrated in FIGS. 33A and 33B, the first reinforcing part 31 is provided so as to straddle the conductive layer constituting the wiring 52 and the conductive layer constituting the electronic component 51. It is thus possible to suppress damage to the conductive layer or the like at the border between the conductive layer constituting the wiring 52 and the conductive layer constituting the electronic component 51. As illustrated in FIG. 33A, the through-hole of the electronic component 51 may be partially positioned in an opening 31p of the first reinforcing part 31.

Tenth Modification Example

Figure 34:
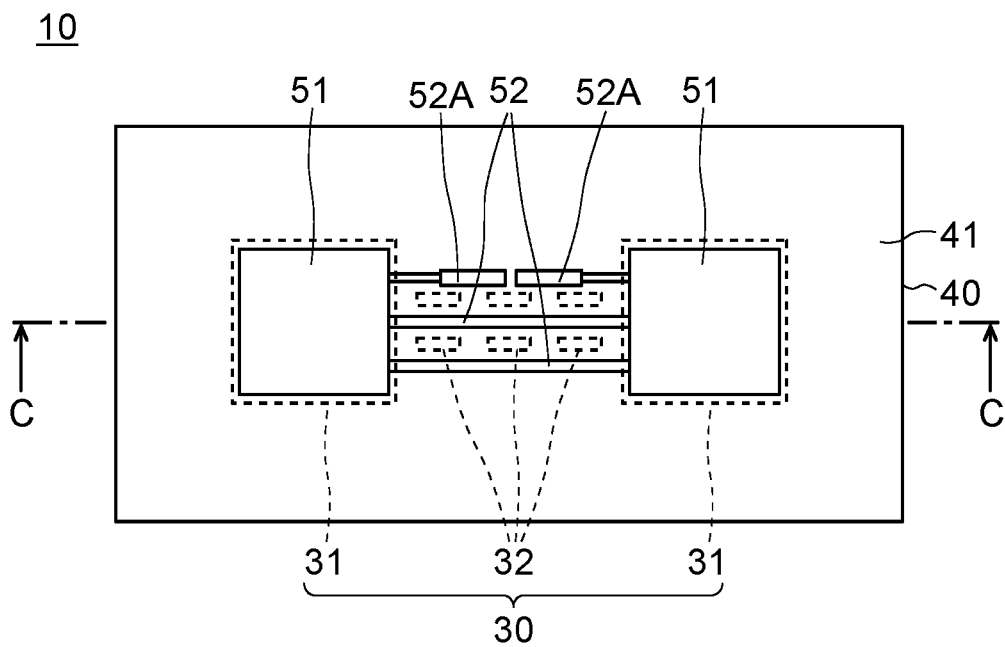
FIG. 34 is a plan view illustrating a wiring board according to a tenth modification example.

FIG. 34 is a plan view illustrating a modification example of the wiring board 10. Electrodes 52A are further provided, in addition to the wiring 52, in the wiring board 10. The wiring 52 extends so as to electrically connect two constituent elements. In the example illustrated in FIG. 34, the wiring 52 extends so as to electrically connect two electronic components 51. The electrode 52A, on the other hand, is electrically connected to only one constituent element. In the example illustrated in FIG. 34, the electrodes 52A are electrically connected to one electronic component 51 via the wiring 52. As illustrated in FIG. 34, the electrode 52A may have a larger width than the wiring 52. Furthermore, the electrode 52A may have a shape that extends in the same direction as the wiring 52.

Figure 35:
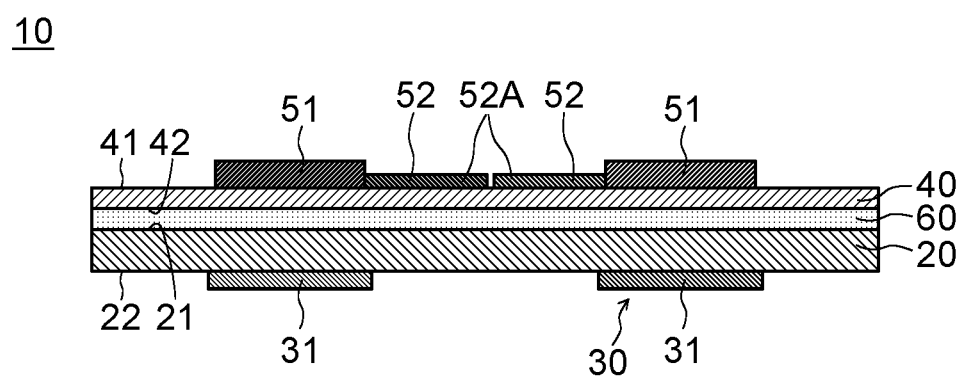
FIG. 35 is a cross-sectional view illustrating the wiring board according to the tenth modification example.

FIG. 35 is a cross-sectional view illustrating a case where the wiring board of FIG. 34 is cut along a line C-C. As illustrated in FIG. 35, the electrode 52A may include a conductive layer integral to the conductive layer constituting the wiring 52.

Like the wiring 52, a meandering shape section may occur in the electrode 52A when the tensile stress is removed from the substrate 20 and the substrate 20 contracts. In view of the foregoing, as illustrated in FIG. 34, the second reinforcing part 32 may also be provided in the region between the wiring 52 and the electrode 52A. It is thus possible to restrain an electrical short circuit from occurring when the interval between the wiring 52 and the electrode 52A is shortened due to deformation of the substrate 20.

Eleventh Modification Example

Figure 36:
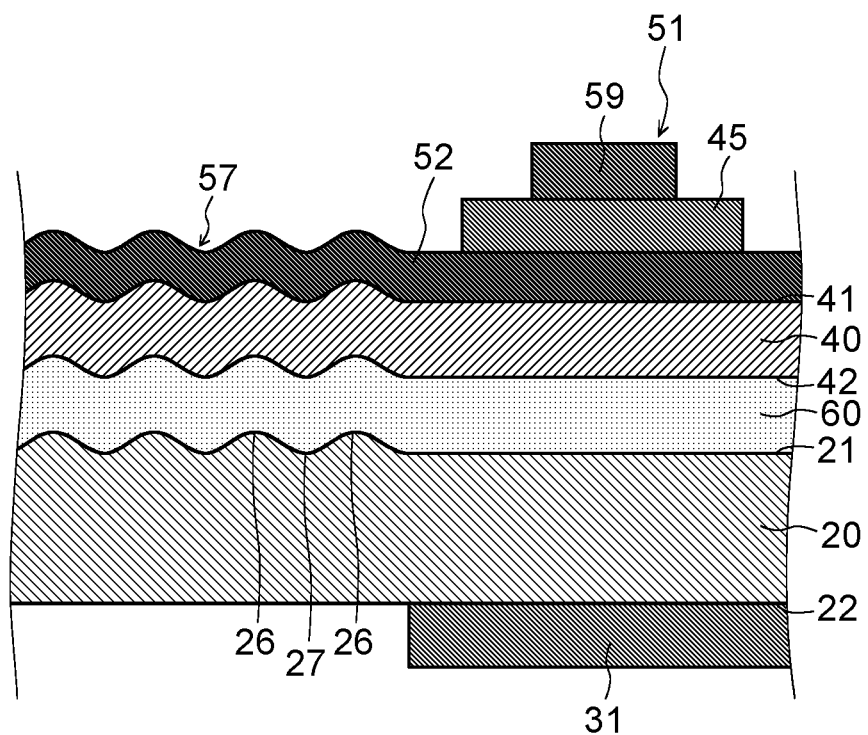
FIG. 36 is a cross-sectional view illustrating a wiring board according to an eleventh modification example.

FIG. 36 is a plan view illustrating a modification example of the wiring board 10. In addition to the wiring 52, intersecting wiring 59 which is stacked on the wiring 52 via an insulating layer 45 is further provided to the wiring board 10. In this modification example, the intersecting wiring 59 constitutes the electronic component 51. The intersecting wiring 59 extends so as to intersect the wiring 52 in a plan view. By providing the insulating layer 45 between the wiring 52 and the intersecting wiring 59, it is possible to restrain an electrical short circuit from occurring between the intersecting wiring 59 and the wiring 52. As the material constituting the insulating layer 45, polyimide-, acrylic-, urethane- and epoxy-based organic resins, or inorganic materials such as $SiO_2$ or alumina may be used.

As illustrated in FIG. 36, the first reinforcing part 31 is provided so as to straddle the conductive layer constituting the wiring 52 and the conductive layer of the intersecting wiring 59 constituting the electronic component 51. It is thus possible to restrain the insulating layer 45 from cracking or deteriorating in insulation performance when stress such as extension or bending, for example, is applied to the wiring board 10. Therefore, it is thus possible to restrain an electrical short circuit from occurring between the wiring 52 and the intersecting wiring 59.

(Wiring board modification example)

In the foregoing embodiment and modification examples, the example in which the wiring board 10 is provided with the electronic component 51, which is installed on the first surface 21 side of the substrate 20, is illustrated. However, the present disclosure is not limited to or by this example. The wiring board 10 need not be provided with the electronic component 51. For example, the meandering shape section 57 may also be produced in the substrate 20 in a state where the electronic component 51 is not installed. In addition, the support substrate 40 may be bonded to the substrate 20 with the electronic component 51 not being installed. Furthermore, the wiring board 10 may also be shipped in a state where the electronic component 51 is not installed.

Note that, although several modification examples have been described for the foregoing embodiment, it goes without saying that a plurality of modification examples may also be suitably combined and applied.

Embodiment Examples

Next, the present invention will be explained more specifically by means of embodiment examples and comparative examples, but as long as not departing from the spirit of the present invention, the present invention is not limited to or by the following embodiment examples.

Embodiment Example 1

The wiring board 10 as illustrated in FIG. 14 was produced. The wiring board 10 included the substrate 20, the wiring 52 provided on the first surface 21 of the substrate 20, and the reinforcing member 30 provided on the second surface 22 of the substrate 20. A method for manufacturing the wiring board 10 will be described hereinbelow.

«Preparation of Substrate and Reinforcing Member»

A stacked body that functions as the substrate 20 and that is provided with an 80 μm-thick urethane sheet and a 12 μm-thick rolled copper foil bonded using thermal lamination to a second surface of the urethane sheet was produced. Next, the copper foil of the stacked body was patterned by means of etching and photolithography using a positive type photoresist. FE-350Z (manufactured by Adeka Chemical Supply Corporation) was used as the etchant. The patterned copper foil functions as the reinforcing member 30. In this embodiment example, the reinforcing member 30 includes a square-shaped copper foil solid pattern with 5-mm sides that functions as the foregoing first reinforcing part 31.

Furthermore, a portion of the stacked body was removed as a sample and the elastic moduli of the substrate 20 and the reinforcing member 30 were measured by means of tensile testing. More specifically, the elastic modulus of the substrate 20 was measured by means of tensile testing in conformance with JIS K6251. The elastic modulus of the substrate 20 was 5 MPa. Furthermore, the elastic modulus of the reinforcing member 30 was measured by means of tensile testing in conformance with ASTM D882. The elastic modulus of the reinforcing member 30 was 100 GPa.

«Formation of Wiring»

After providing the first reinforcing part 31 on the second surface 22 of the substrate 20 comprising a urethane sheet, the substrate 20 was extended biaxially by a multiple of 1.5. Thereafter, a conductive paste containing a solvent, a binder resin, and conductive particles was patterned by means of screen printing on the first surface of the substrate 20 in the biaxially extended state. Diethylene glycol monoethyl ether acetate was used as the solvent. Urethane was used as the binder resin. Silver particles were used as the conductive particles. After the patterning, the solvent was volatilized by being annealed for thirty minutes at 80° C. in an oven, thereby forming the wiring 52. The wiring 52 was configured to form the electrode pair with a thickness of 20 μm, a line width of 100 μm, and an interval of 500 μm at the center of the first reinforcing part 31.

Thereafter, an LED chip with the dimensions 1.0×0.5 mm was installed between the electrode pair by using a conductive adhesive. CL-3160 manufactured by Kaken-Techno Co. Ltd. was used as the conductive adhesive. Thereafter, the extension of the substrate 20 was released. The meandering shape section thus occurred in the front face of the wiring 52 in the region other than the first reinforcing part 31, and the wiring board 10 contracted. At such time, the conductive connection of the LED chip was maintained, and the LED chip remained lit.

Embodiment Example 2

The wiring board 10 as illustrated in FIG. 1 was produced. The wiring board 10 included the substrate 20, the reinforcing member 30 provided on the second surface 22 of substrate 20, the support substrate 40 bonded to the first surface 21 of the substrate 20, and the wiring 52 provided on the first surface of the support substrate 40. A method for manufacturing the wiring board 10 will be described hereinbelow.

The first reinforcing part 31 was provided on the second surface 22 of the substrate 20 as per the case of embodiment example 1. In addition, an adhesive sheet 8146 manufactured by 3M, which functions as the adhesive layer 60, was laminated on the first surface 21 of the substrate 20.

Furthermore, a 1-μm thick polyethylene naphthalate (PEN) film that functions as the support substrate 40 was prepared. Thereafter, a conductive paste containing a solvent, a binder resin, and conductive particles was patterned by means of screen printing on the first surface 41 of the support substrate 40. Diethylene glycol monoethyl ether acetate was used as the solvent. Urethane was used as the binder resin. Silver particles were used as the conductive particles. After the patterning, the solvent was volatilized by being annealed for thirty minutes at 80° C. in an oven, thereby forming the wiring 52. The wiring 52 was configured to form the electrode pair with a thickness of 20 μm, a line width of 100 μm, and an interval of 500 μm.

Furthermore, a portion of the support substrate 40 was removed as a sample, and the elastic modulus of the support substrate 40 was measured by means of tensile testing in conformance with ASTM D882. The elastic modulus of the support substrate 40 was 2.2 GPa.

Next, the substrate 20, where the first reinforcing part 31 and adhesive layer 60 are provided, was extended biaxially by a multiple of 1.5. Thereafter, the support substrate 40, where the wiring 52 is provided, was bonded to the first surface of the substrate 20 in the biaxially extended state. At such time, the substrate 20 was bonded to the support substrate 40 such that the wiring 52 formed the electrode pair at an interval of 500 μm in the center of the first reinforcing part 31.

Thereafter, an LED chip with the dimensions 1.0×0.5 mm was installed between the electrode pair by using a conductive adhesive. CL-3160 manufactured by Kaken-Techno Co. Ltd. was used as the conductive adhesive. Thereafter, the extension of the substrate 20 was released. The meandering shape section thus occurred in the front face of the wiring 52 in the region other than the first reinforcing part 31, and the wiring board 10 contracted. At such time, the conductive connection of the LED chip was maintained, and the LED chip remained lit.

Comparative Example 1

The wiring board 10 was produced as per the case of embodiment example 1 except for the following. In this example, the wiring board 10 was not provided with the first reinforcing part 31. In this case, when the wiring board 10 contracted after releasing the extension of the substrate 20, the conductive connection of the LED chip was broken as contraction occurred, and the light of the LED went out.

Comparative Example 2

The wiring board 10 was produced as per the case of embodiment example 2 except for the following. In this example, the wiring board 10 was not provided with the first reinforcing part 31. In this case, when the wiring board 10 contracted after releasing the extension of the substrate 20, the conductive connection of the LED chip was broken as contraction occurred, and the light of the LED went out.

Embodiment Example 3

A stacked body that functions as the substrate 20 and that is provided with an 80 μm-thick urethane sheet and a 12 μm-thick rolled copper foil bonded using thermal lamination to a second surface of the urethane sheet was prepared as per the case of embodiment example 1. Next, the copper foil of the stacked body was patterned by means of etching and photolithography using a positive type photoresist. Thus, a plurality of copper foil solid patterns having a 50 μm×1 mm shape that functions as the foregoing second reinforcing part 32 was formed on the second surface 22 of the substrate 20.

Next, the substrate 20 where the second reinforcing part 32 is provided was extended biaxially by a multiple of 1.5 as per the case of embodiment example 1. Thereafter, the wiring 52 was formed on the first surface of the substrate 20 in the biaxially extended state as per the case of embodiment example 1. In the present embodiment, a pair of wirings 52 with a line width of 100 μm were arranged at an interval of 100 μm so as to be parallel to each other. At such time, the foregoing second reinforcing part 32 was arranged between the pair of wirings 52 at an interval of 100 μm such that the longitudinal direction of the second reinforcing part 32 is parallel to the direction of the wirings 52.

Thereafter, the extension of the substrate 20 is released. At such time, an electrical short circuit did not occur in the pair of wirings 52.

Embodiment Example 4

A plurality of second reinforcing parts 32 were provided on the second surface 22 of the substrate 20 as per the case of embodiment example 3. In addition, an adhesive sheet 8146 manufactured by 3M, which functions as the adhesive layer 60, was laminated on the first surface 21 of the substrate 20.

Furthermore, a 1-μm thick polyethylene naphthalate (PEN) film that functions as the support substrate 40 was prepared as per the case of embodiment example 2. Thereafter, the wiring 52 was formed on the first surface 41 of the support substrate 40. In the present embodiment, a pair of wirings 52 with a line width of 100 μm were arranged at an interval of 100 μm so as to be parallel to each other, as per the case of embodiment example 3.

Next, as per the case of embodiment example 2, the substrate 20, where the second reinforcing part 32 and adhesive layer 60 are provided, was extended biaxially by a multiple of 1.5, and then the support substrate 40 where the wiring 52 is provided is bonded to the first surface of the substrate 20. At such time, the substrate 20 and support substrate 40 were bonded so that the foregoing second reinforcing part 32 was arranged between the pair of wirings 52 at an interval of 100 μm such that the longitudinal direction of the second reinforcing part 32 is parallel to the direction of the wirings 52.

Thereafter, the extension of the substrate 20 is released. At such time, an electrical short circuit did not occur in the pair of wirings 52.

Comparative Example 3

The wiring board 10 was produced as per the case of embodiment example 3 except for the following. In this example, the wiring board 10 was not provided with the second reinforcing part 32. In this case, an electrical short circuit occurred in the pair of wirings 52 after the extension of the substrate 20 was released.

Comparative Example 4

The wiring board 10 was produced as per the case of embodiment example 4 except for the following. In this example, the wiring board 10 was not provided with the second reinforcing part 32. In this case, an electrical short circuit occurred in the pair of wirings 52 after the extension of the substrate 20 was released.

Embodiment Example 5

A substrate 20 on which the second reinforcing part 32 illustrated in embodiment example 4 was provided on the second surface 22 in addition to the first reinforcing part 31 illustrated in embodiment example 2 was prepared. In addition, an adhesive sheet 8146 manufactured by 3M, which functions as the adhesive layer 60, was laminated on the first surface 21 of the substrate 20.

Furthermore, a 1-μm thick polyethylene naphthalate (PEN) film that functions as the support substrate 40 was prepared as per the case of embodiment example 2. Next, the wiring 52 was formed on the first surface 41 of the support substrate 40 as per the case of embodiment example 2. The wiring 52 was configured to form the electrode pair with a thickness of 20 μm, a line width of 100 μm, and an interval of 500 μm.

Next, the substrate 20, where the first reinforcing part 31, the second reinforcing part 32, and the adhesive layer 60 are provided, was extended biaxially by a multiple of 1.5, and then the support substrate 40 where the wiring 52 is provided was bonded to the first surface of the substrate 20. At such time, the substrate 20 was bonded to the support substrate 40 such that the wiring 52 formed the electrode pair at an interval of 500 μm in the center of the first reinforcing part 31 and such that the foregoing second reinforcing part 32 overlapped the wiring 52 in a position spaced apart from the first reinforcing part 31.

Thereafter, an LED chip with the dimensions 1.0×0.5 mm was installed between the electrode pair by using a conductive adhesive. CL-3160 manufactured by Kaken-Techno Co. Ltd. was used as the conductive adhesive. Thereafter, the extension of the substrate 20 was released. The meandering shape section thus occurred in the front face of the wiring 52 in the region other than the first reinforcing part 31, and the wiring board 10 contracted.

Subsequently, the power supply terminal was connected to the wiring 52 overlapping the second reinforcing part 32 and it was confirmed that the LED chip was lit as a result. At such time, because unevenness did not occur in the wiring 52 overlapping the second reinforcing part 32, a stable connection was possible.

Embodiment Examples 6

As the wiring board 10, a wiring board 10, in which the first reinforcing part 31 as illustrated in FIG. 25 is embedded in the substrate 20 so as to be exposed to the first surface 21 of the substrate 20, was produced. A method for manufacturing the wiring board 10 will be described hereinbelow.

«Preparation of Substrate and Reinforcing Member»

An adhesive sheet 8146 (manufactured by 3M) was prepared as the adhesive layer 60. Thereafter, a polyimide film (manufactured by Ube Industries, Ltd.: Upilex, 125 μm thick) 5 mm×5 mm in size was provided as the first reinforcing part 31 on the adhesive sheet. Next, as the substrate 20, polydimethylsiloxane (hereinafter referred to as PDMS) for two-liquid adduct condensation was coated, in a thickness of approximately 1 mm, on the surface of the adhesive layer 60 where the first reinforcing part 31 is installed, thereby embedding the first reinforcing member, and the coating was cured. A stacked body that constitutes part of the wiring board 10 illustrated in FIG. 25 was thus obtained. In the stacked body, the first reinforcing part 31 is embedded in the substrate 20 on the first surface 21 side, and the adhesive layer 60 is provided on the first surface 21 of the substrate 20.

Furthermore, a portion of the stacked body was removed as a sample and the elastic moduli of the substrate 20 and the first reinforcing part 31 were measured by means of tensile testing. More specifically, the elastic modulus of the substrate 20 was measured by means of tensile testing in conformance with JIS K6251. As a result, the elastic modulus of the substrate 20 was 0.05 MPa. Furthermore, the elastic modulus of the first reinforcing part 31 was measured by means of tensile testing in conformance with ASTM D882. As a result, the elastic modulus was 7 GPa.

«Preparation of Support Substrate and Formation of Wiring»

Furthermore, a 1-μm thick PEN film that functions as the support substrate 40 was prepared. Thereafter, a copper layer with a 1 μm thickness was formed using vapor deposition on the first surface 41 of the support substrate 40. Next, the copper layer was patterned using photolithography and etching and the wiring 52 was formed. The wiring 52 was configured to form the electrode pair with a line width of 200 μm and an interval of 500 μm.

Furthermore, a portion of the support substrate 40 was removed as a sample, and the elastic modulus of the support substrate 40 was measured by means of tensile testing in conformance with ASTM D882. As a result, the elastic modulus of the support substrate 40 was 2.2 GPa.

Next, the substrate 20, where the first reinforcing part 31 and adhesive layer 60 are provided, was extended biaxially by a multiple of 1.5, and then the second surface 42 of the support substrate 40 where the wiring 52 is provided is bonded to the adhesive layer 60. At such time, bonding was performed such that the wiring 52 formed the electrode pair at an interval of 500 μm in the center of the first reinforcing part 31.

Thereafter, an LED chip with the dimensions 1.0×0.5 mm was installed between the electrode pair by using a conductive adhesive. CL-3160 manufactured by Kaken-Techno Co. Ltd. was used as the conductive adhesive. Thereafter, the extension of the substrate 20 was released. The meandering shape section thus occurred in the front face of the wiring 52 in the region other than the first reinforcing part 31, and the wiring board 10 contracted. At such time, the conductive connection of the LED chip was maintained, and the LED chip remained lit.

Comparative Example 5

The wiring board 10 was produced as per the case of embodiment example 6 except for the following. In this example, the wiring board 10 was not provided with the first reinforcing part 31. In this case, when the wiring board 10 contracted after releasing the extension of the substrate 20, the conductive connection of the LED chip was broken as contraction occurred, and the light of the LED went out.

REFERENCE SIGNS LIST

10 Wiring board
20 Substrate
21 First surface
22 Second surface
30 Reinforcing member
31 First reinforcing part 32 Second reinforcing part
33 Third reinforcing part
40 Support substrate
41 First surface
42 Second surface
51 Electronic component
52 Wiring
53, 54 Peaks
55, 56 Valleys
57 Meandering shape section
58 Electrode pad
60 Adhesive layer

The invention claimed is:

1. A wiring board, comprising:
a substrate having a first elastic modulus, the substrate including a first surface and a second surface positioned on the opposite side of the first surface;
wiring positioned on the first surface side of the substrate and connected to an electrode of an electronic component mounted on the wiring board;
a reinforcing member having a second elastic modulus greater than the first elastic modulus, the reinforcing member at least including a first reinforcing part that is positioned on the first surface side of the substrate or on the second surface side of the substrate and that at least partially overlaps the electronic component mounted on the wiring board when viewed along the normal direction of the first surface of the substrate; and
a support substrate that is positioned between the wiring and the first surface of the substrate, that is positioned between the electronic component and the first surface of the substrate, that has a third elastic modulus greater than the first elastic modulus, and that supports the wiring,
wherein the reinforcing member overlaps the support substrate when viewed along the normal direction of the first surface,
wherein the wiring includes a first end and a second end opposite the first end that both overlap the support substrate and the substrate when viewed along the normal direction of the first surface, and
wherein the wiring includes a section that does not overlap the reinforcing member when viewed along the normal direction of the first surface and that has a meandering shape section including pluralities of peaks and valleys aligned along a planar direction of the first surface of the substrate.

2. The wiring board according to claim 1, wherein the wiring includes a plurality of wirings and the electronic component includes two or more electrodes connected to the wirings, and
wherein the reinforcing member further includes a second reinforcing part positioned between two of the wirings connected to the electrodes of the electronic component when viewed along the normal direction of the first surface.

3. The wiring board according to claim 2, wherein the second reinforcing part separates from the first reinforcing part when viewed along the normal direction of the first surface.

4. The wiring board according to claim 1, wherein the wiring board further comprises an electrode pad being electrically connected to the wiring or electrically connected to the electronic component mounted on the wiring board, and
wherein the reinforcing member further includes a third reinforcing part overlapping the electrode pad when viewed along the normal direction of the first surface.

5. The wiring board according to claim 1, wherein the amplitude of the meandering shape section of the wiring is 1 µm or more.

6. The wiring board according to claim 1, wherein the amplitude of peaks and valleys on the second surface of the substrate is smaller than the amplitude of peaks and valleys on the first surface of the substrate,
wherein the peaks and the valleys on the second surface appear in a section overlapping the meandering shape section; and
wherein the peaks and the valleys on the first surface appear in a section overlapping the meandering shape section.

7. The wiring board according to claim 6, wherein the amplitude of the peaks and the valleys on the second surface of the substrate is a 0.9 multiple or less of the amplitude of the peaks and the valleys on the first surface of the substrate,
wherein the peaks and the valleys on the second surface appear in the section overlapping the meandering shape section; and
wherein the peaks and the valleys on the first surface appear in the section overlapping the meandering shape section.

8. The wiring board according to claim 1, wherein the periodicity of peaks and valleys on the second surface of the substrate is greater than the periodicity of peaks and valleys on the first surface of the substrate,
wherein the peaks and the valleys on the second surface appear in a section overlapping the meandering shape section; and
wherein the peaks and the valleys on the first surface appear in a section overlapping the meandering shape section.

9. The wiring board according to claim 8, wherein the periodicity of the peaks and the valleys on the second surface of the substrate is a 1.1 multiple or more of the periodicity of the peaks and the valleys on the first surface of the substrate,
wherein the peaks and the valleys on the second surface appear in the section overlapping the meandering shape section; and
wherein the peaks and the valleys on the first surface appear in the section overlapping the meandering shape section.

10. The wiring board according to claim 1, wherein, when the periodicity of peaks and valleys on the first surface of the substrate is F, the positions of peaks and valleys on the second surface of the substrate are displaced from the positions of the peaks and the valleys on the first surface of the substrate,
wherein the peaks and the valleys on the second surface appear in a section overlapping the meandering shape section; and
wherein the peaks and the valleys on the first surface appear in a section overlapping the meandering shape section.

11. The wiring board according to claim 10, wherein the positions of the peaks and the valleys on the second surface of the substrate are displaced by 0.1×F or more from the positions of the peaks and the valleys on the first surface of the substrate,
wherein the peaks and the valleys on the second surface appear in the section overlapping the meandering shape section; and wherein the peaks and the valleys on the first surface appear in the section overlapping the meandering shape section.

12. The wiring board according to claim 1, wherein, when a resistance value of the wiring in a first state in which tensile stress along a planar direction of the first surface of the substrate is not applied to the substrate is referred to as the first resistance value and a resistance value of the wiring in a second state in which tensile stress is applied to the substrate such that the substrate is extended by 30% in comparison with the first state in the planar direction of the first surface is referred to as the second resistance value, the ratio of the absolute value of the difference between the first resistance value and the second resistance value to the first resistance value is 20% or less.

13. The wiring board according to claim 1, wherein the reinforcing member is positioned on the second surface side of the substrate.

14. The wiring board according to claim 1, wherein the reinforcing member is positioned between the first surface of the substrate and the electronic component mounted on the wiring board.

15. The wiring board according to claim 1, wherein the reinforcing member is positioned on either the second surface side of the substrate or between the first surface of the substrate and the electronic component mounted on the wiring board.

16. The wiring board according to claim 1,
wherein the reinforcing member is positioned on the second surface side of the substrate, and
wherein the wiring is positioned on the first surface of the substrate.

17. The wiring board according to claim 1, wherein the substrate contains a silicone rubber.

18. The wiring board according to claim 1, wherein the reinforcing member includes a metallic layer.

19. The wiring board according to claim 1, wherein the wiring includes a plurality of conductive particles.

20. The wiring board according to claim 1, further comprising the electronic component positioned on the first surface side of the substrate, the electronic component having the electrode which is electrically connected to the wiring.

21. The wiring board according to claim 1, wherein the reinforcing member is embedded in the substrate so as to be exposed to the first surface of the substrate.

22. The wiring board according to claim 21, comprising an adhesive layer positioned between the substrate and the support substrate,
wherein the reinforcing member is in contact with the adhesive layer.

23. The wiring board according to claim 1, wherein the support substrate separates from the first reinforcing part in a thickness direction of the wiring board.

24. The wiring board according to claim 23, comprising an adhesive layer positioned between the support substrate and the first reinforcing part.

25. The wiring board according to claim 1, wherein the third elastic modulus of the support substrate is different from the second elastic modulus of the reinforcing member.

* * * * *